United States Patent
Lee et al.

(10) Patent No.: US 12,362,382 B2
(45) Date of Patent: Jul. 15, 2025

(54) SOLID ELECTROLYTE, METHOD OF PREPARING THE SAME, LITHIUM-AIR BATTERY INCLUDING THE SOLID ELECTROLYTE, AND ELECTROCHEMICAL DEVICE INCLUDING THE SOLID ELECTROLYTE

(71) Applicants: Samsung Electronics Co., Ltd., Suwon-si (KR); Industry-University Cooperation Foundation Hanyang University ERICA Campus, Ansan-si (KR)

(72) Inventors: Dongjoon Lee, Suwon-si (KR); Taejoo Park, Asan-si (KR); Jungock Park, Yongin-si (KR)

(73) Assignees: SAMSUNG ELECTRONICS CO, LTD., Gyeonggi-Do (KR); INDUSTRY-UNIVERSITY COOPERATION FOUNDATION HANYANG UNIVERSITY ERICA CAMPUS, Gyeonggi-Do (KR)

( * ) Notice: Subject to any disclaimer, the term of this patent is extended or adjusted under 35 U.S.C. 154(b) by 338 days.

(21) Appl. No.: 17/199,780

(22) Filed: Mar. 12, 2021

(65) Prior Publication Data

US 2021/0296687 A1   Sep. 23, 2021

(30) Foreign Application Priority Data

Mar. 20, 2020   (KR) .................. 10-2020-0034663

(51) Int. Cl.
  *H01M 10/0562*   (2010.01)
  *C23C 14/08*     (2006.01)
  (Continued)

(52) U.S. Cl.
  CPC ......... *H01M 10/0562* (2013.01); *C23C 14/08* (2013.01); *C23C 16/40* (2013.01);
  (Continued)

(58) Field of Classification Search
  CPC .............................................. H01M 10/0562
  See application file for complete search history.

(56) References Cited

U.S. PATENT DOCUMENTS 9,843,071 B2   12/2017   Kato
10,818,970 B2  10/2020   Yoon et al.
(Continued)

FOREIGN PATENT DOCUMENTS

CN   110556574    * 12/2019
CN   110556574 A    12/2019
(Continued)

OTHER PUBLICATIONS

Extended EP search report mailed Aug. 10, 2021 of EP Patent Application No. 21162910.0.
(Continued)

*Primary Examiner* — Jonathan Crepeau
(74) *Attorney, Agent, or Firm* — CANTOR COLBURN LLP

(57) ABSTRACT

A solid electrolyte includes a first layer including an inorganic lithium-ion conductor, and a second layer disposed on at least one surface of the first layer, wherein the second layer includes at least one of a compound represented by Formula 1 or a compound represented by Formula 2:

$$Li_xM_yO_z \quad \text{Formula 1}$$

$$Li_xM_y(OH)_z \quad \text{Formula 2}$$

wherein, in Formulae 1 and 2,
  each M is independently at least one of a monovalent element to a hexavalent element, and
  each of x, y, and z are independently $0<x<5$, $0<y<5$, and $0<z<5$.

21 Claims, 16 Drawing Sheets

(51) Int. Cl.
  *C23C 16/40* (2006.01)
  *H01M 12/06* (2006.01)
  *H01M 12/08* (2006.01)

(52) U.S. Cl.
  CPC ........... *H01M 12/06* (2013.01); *H01M 12/08* (2013.01); *H01M 2300/0068* (2013.01); *H01M 2300/0071* (2013.01); *H01M 2300/0094* (2013.01)

(56) References Cited

U.S. PATENT DOCUMENTS

| | | |
|---|---|---|
| 2014/0154586 A1 | 6/2014 | Hayashi et al. |
| 2016/0351953 A1 | 12/2016 | Wöhrle et al. |
| 2019/0051936 A1* | 2/2019 | Meshcheryakov ..... H01M 6/40 |
| 2019/0148766 A1 | 5/2019 | Antonopoulos |
| 2021/0184201 A1 | 6/2021 | Choi et al. |
| 2021/0399337 A1* | 12/2021 | Choi ................ H01M 10/0562 |

FOREIGN PATENT DOCUMENTS

| | | | |
|---|---|---|---|
| EP | 3168925 A1 | | 5/2017 |
| JP | 2014096351 | * | 5/2014 |
| JP | 2021034199 | * | 3/2021 |
| KR | 1020130122575 | * | 11/2013 |
| KR | 1020190079132 A | | 7/2019 |

OTHER PUBLICATIONS

Tao Zhang et al., "Aqueous Lithium/Air Rechargeable Batteries," Chem. Lett., Jun. 4, 2011, pp. 668-673, vol. 40.

* cited by examiner

SOLID ELECTROLYTE, METHOD OF PREPARING THE SAME, LITHIUM-AIR BATTERY INCLUDING THE SOLID ELECTROLYTE, AND ELECTROCHEMICAL DEVICE INCLUDING THE SOLID ELECTROLYTE

CROSS-REFERENCE TO RELATED APPLICATION

This application claims priority to and the benefit of Korean Patent Application No. 10-2020-0034663, filed on Mar. 20, 2020, in the Korean Intellectual Property Office, and all the benefits accruing therefrom under 35 U.S.C. § 119, the content of which is incorporated herein in its entirety by reference.

BACKGROUND

1. Field

The present disclosure relates to a solid electrolyte, a method of preparing the same, and a lithium-air battery and an electrochemical device which include the solid electrolyte.

2. Description of the Related Art

In a lithium-air battery, lithium is used as the anode and it is unnecessary to store air as a cathode active material in the battery. Thus a lithium-air battery may be implemented as a high-capacity battery. In addition, lithium-air batteries have a high theoretical specific energy of 3,500 Wh/kg or more.

A lithium-air battery includes a lithium anode, a protective film, which allows lithium ions to pass therethrough while protecting the lithium anode from oxygen or moisture, and a cathode carrier. A lithium-air battery provides electrical energy through an oxidation-reduction reaction of oxygen introduced from the air. An organic liquid electrolyte, an aqueous liquid electrolyte, or a solid electrolyte may be used as an electrolyte of the cathode. There remains a need for improved battery materials.

SUMMARY

Provided is a solid electrolyte that is stable in the presence of moisture and alkalinity.

Provided is a lithium-air battery including the solid electrolyte.

Provided is an electrochemical device including the solid electrolyte.

Provided is a method of preparing the solid electrolyte.

Additional aspects will be set forth in part in the description which follows and, in part, will be apparent from the description.

According to an aspect, a solid electrolyte includes:
a first layer including an inorganic lithium-ion conductor; and
a second layer disposed on at least one surface of the first layer, wherein the second layer includes at least one of a compound represented by Formula 1 or a compound represented by Formula 2:

$$Li_xM_yO_z \quad \text{Formula 1}$$

$$Li_xM_y(OH)_z \quad \text{Formula 2}$$

wherein, in Formulae 1 and 2,
each M is independently at least one of a monovalent element to a hexavalent element, and
each of x, y, and z are independently 0<x<5, 0<y<5, and 0<z<5.

According to an aspect, a lithium-air battery includes: a cathode; an anode; and an electrolyte disposed between the cathode and the anode, wherein the electrolyte includes the solid electrolyte.

According to an aspect, an electrochemical device includes the solid electrolyte.

The electrochemical device may include at least one of a battery, an accumulator, a supercapacitor, a fuel cell, a sensor, or an electrochromic device.

According to an aspect, a method of preparing a solid electrolyte includes:
providing a first layer including an inorganic lithium-ion conductor;
depositing a compound represented by Formula 3 on at least one surface of the first layer to form a coating; and
heat-treating the coating on the at least one surface of the first layer to form the second layer,
wherein the second layer includes at least one of a compound represented by Formula 1 or a compound represented by Formula 2, $$Li_sM_yO_z \quad \text{Formula 3}$$

wherein, in Formula 3,
M is at least one of a monovalent element to a hexavalent element, and
0≤s<1, 0<y<5, and 0<z<5, $$Li_xM_yO_z \quad \text{Formula 1}$$

$$Li_xM_y(OH)_z \quad \text{Formula 2}$$

wherein, in Formulae 1 and 2,
each M is independently at least one of a monovalent element to a hexavalent element, and
each of x, y, and z are independently 0<x<1, 0<y<5, and 0<z<5.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
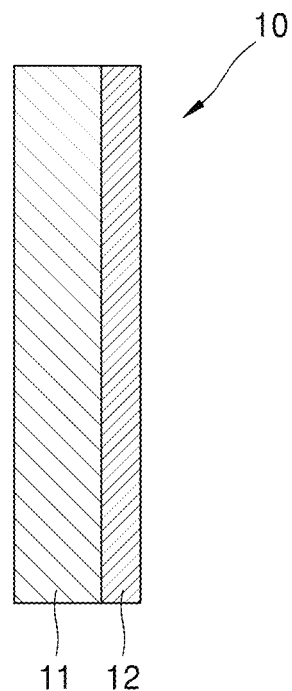
FIG. 1 is a schematic view illustrating a structure of an embodiment of a solid electrolyte.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which example embodiments are shown. The present disclosure may, however, be embodied in many different forms, should not be construed as being limited to the embodiments set forth herein, and should be construed as including all modifications, equivalents, and alternatives within the scope of the present disclosure.

The terminology used herein is for the purpose of describing particular embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, parts, components, materials, and/or groups thereof. As used herein, the slash "/" or the term "and/or" includes any and all combinations of one or more of the associated listed items.

In the drawings, the size or thickness of each layer, region, or element are arbitrarily exaggerated or reduced for better understanding or ease of description, and thus the present disclosure is not limited thereto. Throughout the written description and drawings, like reference numbers and labels will be used to denote like or similar elements.

It will also be understood that when an element such as a layer, a film, a region, a component, or a plate is referred to as being "on" another layer or element, it can be "directly on" the other layer or element, or intervening layers, regions, or components may also be present. Although the terms "first," "second," "third," etc. may be used herein to describe various elements, components, regions, and/or layers, these elements, components, regions, and/or layers should not be limited by these terms. These terms are used only to distinguish one component from another, not for purposes of limitation.

The terminology used herein is for the purpose of describing particular embodiments only and is not intended to be limiting. "Or" means "and/or".

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Hereinafter, example embodiments of a solid electrolyte, a method of preparing the solid electrolyte, and a lithium-air battery and an electrochemical device that include the solid electrolyte will be described in greater detail.

A perovskite compound is a compound that is isostructural with perovskite, i.e., $CaTiO_3$.

A garnet compound or garnet-type compound is a compound of the formula $X_3Y_2(SiO_4)_3$, wherein X is a divalent cation, such as $Ca^{2+}$, $Mg^{2+}$, $Fe^{2+}$, $Mn^{2+}$, or a combination thereof, and Y is a trivalent cation, such as $Al^{3+}$, $Fe^{3+}$, $Cr^{3+}$, or a combination thereof, or a compound isostructural with a garnet compound.

A NASICON compound, as used herein, refers to a compound with the chemical formula $Na_{1+x}Zr_2Si_xP_{3-x}O_{12}$, wherein $0<x<3$, or a compound isostructural with NASICON, e.g., $Li_{1+x}Zr_2Si_xP_{3-x}O_{12}$, wherein $0<x<3$.

A lithium super-ion-conductor (LISICON) compou, as used herein, refers to a compound with the formula $Li_{2+2x}Zn_{1-x}GeO_4$, wherein $0<x<1$, or a compound isostructural with LISICON.

As used herein, an argyrodite compound, an argyrodite-type compound, or a compound having an argyrodite crystal structure means that the compound has a structure that is isostructural with argyrodite, $Ag_8GeS_6$.

Because it is not possible to block 100% of moisture introduced from outside, a small amount of moisture may be present in a lithium-air battery, causing production of lithium hydroxide (LiOH) during charge, and thus a cathode portion of a lithium-air battery may have alkalinity. Such an alkaline condition of the cathode portion in the lithium-air battery may deteriorate a solid electrolyte used as a protective film. The solid electrolyte of the lithium-air battery is not stable in the presence of a strong base such as lithium hydroxide, which is a discharge product of the lithium-air battery, and may cause a reduction in ionic conductivity or cracking of the solid electrolyte in the lithium-air battery. Thus an improved solid electrolyte is needed.

A lithium-air battery desirably has an oxygen-blocking electrolyte layer which protects a lithium anode from external oxygen and moisture. A solid electrolyte used as the electrolyte layer of the lithium-air battery should be reversible in the presence of moisture or air, and to this end, stability in the presence of moisture and lithium hydroxide (LiOH), which is a discharge product, is very important. However, for an existing solid electrolyte, as a cathode becomes basic during discharge of a lithium-air battery, metal ions in the solid electrolyte are dissolved and enter the cathode, and thus ionic conductivity is reduced due to the dissolution of metal ions, and the dissolution of the metal ions causes a reduction in ionic conductivity and the formation of cracks in the lithium-air battery.

Accordingly, to solve the problems of existing solid electrolytes, the present inventors discovered an oxygen-blocking electrolyte layer having improved stability to alkalinity. In an aspect, the oxygen-blocking electrolyte layer can be provided by coating a first layer including a lithium-ion conductor with a compound that is stable to moisture and a strong base to thereby provide a solid electrolyte having a double-layer structure.

According to an aspect, a solid electrolyte comprises:
a first layer comprising an inorganic lithium-ion conductor; and
a second layer disposed on at least one surface of the first layer, wherein the second layer comprises at least one of a compound represented by Formula 1 or a compound represented by Formula 2

  Formula 1

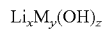  Formula 2 wherein Formulae 1 and 2,
each M is independently at least one of a monovalent element to a hexavalent element, and
each of x, y, and z are independently $0<x<5$, $0<y<5$, and $0<z<5$.

FIG. 1 is a schematic view illustrating a structure of an embodiment of a solid electrolyte 10.

Referring to FIG. 1, the solid electrolyte 10 may include a first layer 11 including an inorganic lithium-ion conductor, and a second layer 12 disposed on the first layer 11 and including the compound represented by Formula 1 or 2. When the compound represented by Formula 1 or 2 is included in the second layer 12, the second layer 12 may function as a protective film for the first layer 11 including the inorganic lithium-ion conductor, the protective film being stable in the presence of moisture and a strong base.

In Formulae 1 and 2, M may be a metal element present as an oxide or a hydroxide at pH 11 and 0 volts (V) relative to the standard hydrogen electrode (SHE), as can be shown in a potential-pH diagram (Pourbaix diagram). A voltage region of about 0 V with respect to the hydrogen electrode corresponds to a region belonging to a charge-discharge voltage range (for example, a range of −1 V to 1.23 V) with respect to a lithium electrode. When the compounds of Formulae 1 and 2 comprise a metal element, which is present as an oxide or a hydroxide, the compounds of Formulae 1 and 2 are stable and do not dissolve in water, i.e., are insoluble in water, at pH 11 to pH 12 and 0 V relative to the standard hydrogen electrode (SHE) in a potential-pH diagram (Pourbaix diagram), and the compounds of Formulae 1 and 2 may be stable even in a basic environment created due to the production of lithium hydroxide, which is a discharge product, during charge and discharge of a lithium-air battery. For example, when the compounds of Formulae 1 and 2 are stable and do not dissolve in water, i.e., are insoluble in water, at pH 11 to pH 12 and 0 V relative to the standard hydrogen electrode (SHE) in a potential-pH diagram (Pourbaix diagram), a content of a metal element in a sample after exposure to lithium hydroxide is less than about 100 parts per million (ppm), less than about 10 ppm, less than about 1 ppm, less than about 100 parts per billion (ppb), or less than about 50 ppb, when analyzed using inductively coupled plasma mass spectrometry (ICPMS), atomic absorption spectroscopy (AAS), or any other suitable technique for quantifying metal ions in an aqueous solution. In an aspect, the compound of Formula 1 or Formula 2 has a solubility of 1 ppb to 1 part per thousand (ppt), 10 ppb to 100 ppm in water at 20° C., when determined by ICPMS.

Figure 3:
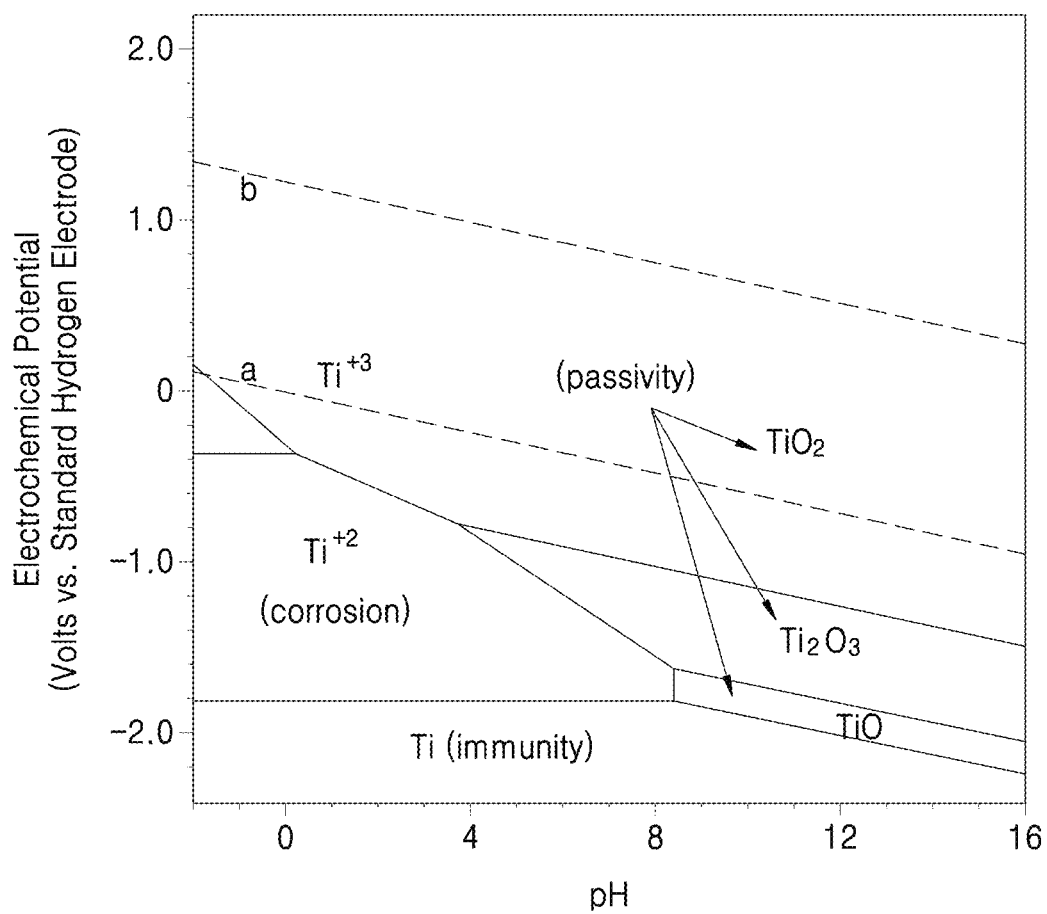
FIG. 3 is a potential-pH diagram (Pourbaix diagram) for titanium (Ti)

For example, a Pourbaix diagram for titanium (Ti) is shown in FIG. 3. Ti may be present in a metal oxide, such as $TiO_2$ at pH 11 to pH 12 and 0 V relative to SHE. Without wishing to be bound by theory, it is found that even when the metal oxide $TiO_2$ becomes $Li_xTiO_2$, which is doped or mixed with lithium, the metal oxide may remain in an oxide form that is stable even under a strong basic condition of lithium hydroxide (LiOH), and may exhibit high ionic conductivity due to reduced resistance in the solid electrolyte.

Figure 4:
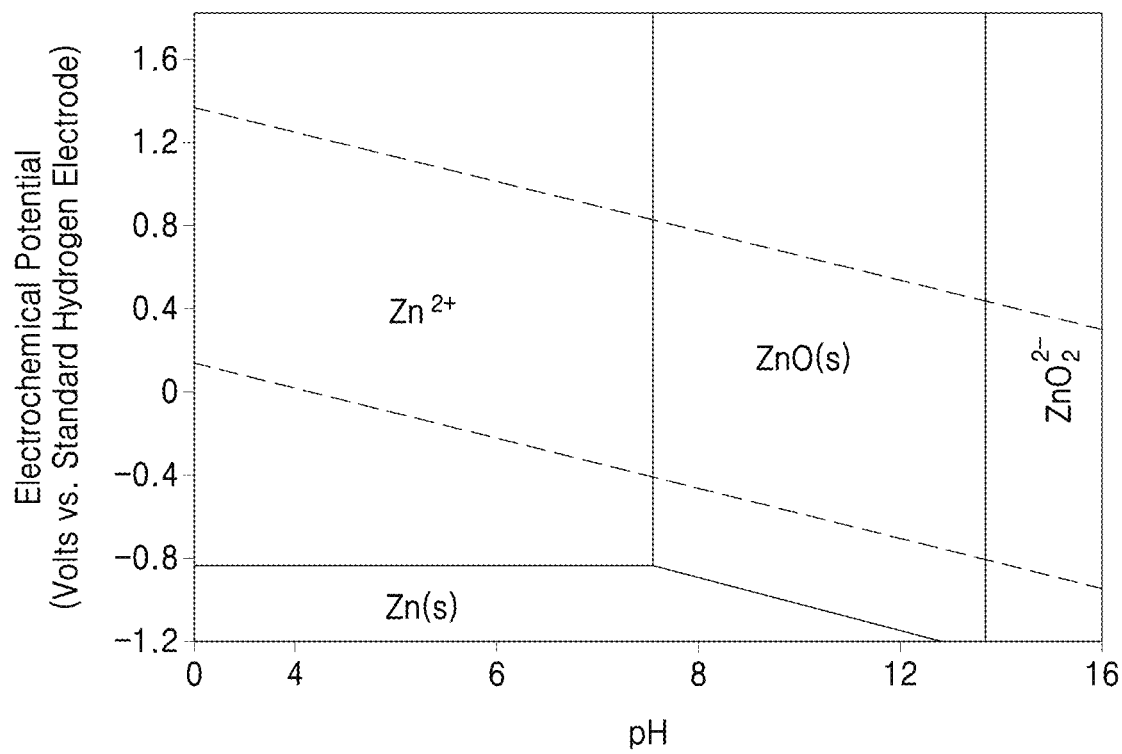
FIG. 4 is a potential-pH diagram for zinc (Zn)

A Pourbaix diagram for zinc (Zn) is also shown in FIG. 4. Like Ti, Zn may be present in a metal oxide, such as ZnO at pH 11 to pH 12 and 0 V relative to SHE. Without wishing to be bound by theory, it is found that even when the metal oxide $ZnO_2$ becomes $Li_xZnO_2$, the metal oxide may remain in an oxide form that is stable even under a strong basic condition and may exhibit high ionic conductivity due to reduced resistance in the solid electrolyte.

Accordingly, due to the arrangement of the second layer including at least one of the compounds represented by Formulae 1 and 2 on at least one surface of the first layer including an inorganic lithium-ion conductor, the solid electrolyte may have improved stability under a strong basic condition, and problems such as reduction in ionic conductivity or cracking may be inhibited.

In Formulae 1 or 2, M may be, for example, at least one of titanium (Ti), tantalum (Ta), zinc (Zn), gallium (Ga), yttrium (Y), lanthanum (La), magnesium (Mg), gadolinium (Gd), hafnium (Hf), scandium (Sc), thorium (Th), lutetium (Lu), calcium (Ca), chromium (Cr), vanadium (V), iron (Fe), copper (Cu), zinc (Zn), zirconium (Zr), strontium (Sr), antimony (Sb), niobium (Nb), molybdenum (Mo), tungsten (W), or barium (Ba). Particularly, for example, M may be at least one of Ti or Zn.

In Formulae 1 or 2, the range of x may be $0<x<5$. In Formula 1, lithium (Li) may be contained in an amount that can be doped in a metal oxide ($M_yO_z$). Particularly, for example, the range of x may be $0<x\leq4$, $0<x\leq3$, $0<x\leq2$, $0<x\leq1$, $0<x\leq0.9$, $0<x\leq0.8$, $0<x\leq0.7$, $0<x\leq0.6$, $0<x\leq0.5$, $0<x\leq0.4$, $0<x\leq0.3$, $0<x\leq0.2$, $0<x\leq0.1$, or $0<x\leq0.05$. When x is within these ranges, a lithium metal oxide or a lithium metal hydroxide that is stable in a basic condition, e.g., at a pH of greater than 7, or in contact with a hydroxide such lithium hydroxide, may be formed.

The compound represented by Formulae 1 or 2 may comprise, for example, at least one of $Li_xTi_{(1-x/4)}O_2$, $Li_xZn_{(1-x/2)}O$, $Li_xZn_{(1-x/2)}(OH)_2$, $Li_xTa_{(2-x/5)}O_5$, $Li_xLa_{(2-x/3)}O_3$, $Li_xGd_{(2-x/3)}O_3$, $Li_xGd_{(1-x/3)}(OH)_3$, $Li_xGa_{(2-x/3)}O_3$, $Li_xY_{(2-x/3)}O_3$, $Li_xHf_{(1-x/2)}O_2$, $Li_xLu_{(2-x/3)}O_3$, $Li_xLa_{(1-x/3)}(OH)_3$, $Li_xMg_{(1-x/2)}O$, or $Li_xMg_{(1-x/2)}(OH)_2$. For example, the compound represented by Formula 1 may comprise at least one of $Li_xTiO_2$ or $Li_xZnO$. In the formulae, x may be $0<x<5$. Particularly, x may be, for example, $0<x\leq4$, $0<x\leq3$, $0<x\leq2$, $0<x\leq1$, $0<x\leq0.9$, $0<x\leq0.8$, $0<x\leq0.7$, $0<x\leq0.6$, $0<x\leq0.5$, $0<x\leq0.4$, $0<x\leq0.3$, $0<x\leq0.2$, $0<x\leq0.1$, or $0<x\leq0.05$.

A portion of the surface of the second layer may be converted into hydroxide. In a case where the second layer is formed using a precursor of a metal such as La, Gd, or Mg that is present in a hydroxide form, which is stable and does not dissolve, i.e., is insoluble, in water at pH 11 to pH 12 and 0 V with respect to SHE in a Pourbaix diagram thereof, and then heat-treated, an oxide represented by Formula 1 may be formed. In this case, a portion of the surface of the second layer exposed to moisture may be converted back into a hydroxide form. Despite the partial conversion into a hydroxide form, the solid electrolyte may be maintained in a state that is stable to alkalinity, and thus may also be stable in a basic environment, e.g., in the presence of lithium hydroxide, which is a discharge product produced during charge and discharge of the lithium-air battery. In this case, the second layer may comprise at least one of $Li_xLa_2O_3$, $Li_xGd_2O_3$, or $Li_xMgO$.

The second layer may have a thickness of about 1 nm to about 30 μm. The second layer may have a thickness of, for example, about 5 nm to about 20 μm, about 10 nm to about 10 μm, or about 50 nm to 5 μm, but embodiments are not limited thereto. Within these thickness ranges, the second layer may effectively function as a protective film that is stable in the presence of moisture and a base.

The inorganic lithium-ion conductor included in the first layer may be any suitable inorganic lithium-ion conductor.

The inorganic lithium-ion conductor included in the first layer may be, for example at least one of a garnet-type compound, an argyrodite-type compound, a lithium super-ion-conductor (LISICON) compound, a sodium super ionic conductor-like (NASICON) compound, a lithium nitride, a lithium hydride, a perovskite compound, or a lithium halide.

The inorganic lithium-ion conductor may comprise, for example, at least one of a garnet-based ceramic $Li_{3+x}La_3M_2O_{12}$ (wherein $0\leq x\leq 5$, M is W, Ta, Te, Nb, and/or Zr), a doped garnet-based ceramic $Li_{3+x}La_3M_2O_{12}$ (wherein $0\leq x\leq 5$, M is W, Ta, Te, Nb, and/or Zr, and a dopant is at least one of Ge, Ta, Nb, Al, Ga, or Sc), $Li_{1+x+y}Al_xTi_{2-x}Si_yP_{3-y}O_{12}$ (wherein $0<x<2$, $0\leq y\leq 3$), $BaTiO_3$, $Pb(Zr_aTi_{1-a})O_3$ ($0\leq a\leq 1$) (PZT), $Pb_{1-x}La_xZr_{1-y}Ti_yO_3$ (PLZT) (wherein $0<x<1$, and $0\leq y<1$), $Pb(Mg_{1/3}Nb_{2/3})O_3$—$PbTiO_3$ (PMN-PT), lithium phosphate ($Li_3PO_4$), lithium titanium phosphate ($Li_xTi_y(PO_4)_3$, $0<x<2$, and $0<y<3$), lithium aluminum titanium phosphate ($Li_xAl_yTi_z(PO_4)_3$, $0<x<2$, $0<y<1$, and $0<z<3$), $Li_{1+x+y}(Al_aGa_{1-a})_x(Ti_bGe_{1-b})_{2-x}Si_yP_{3-y}O_{12}$ (wherein $0\leq x\leq 1$, $0\leq y\leq 1$, $0\leq a\leq 1$, and $0\leq b\leq 1$), lithium lanthanum titanate ($Li_xLa_yTiO_3$, $0<x<2$, and $0<y<3$), lithium germanium thio phosphate ($Li_xGe_yP_zS_w$, $0<x<4$, $0<y<1$, $0<z<1$, and $0<w<5$), lithium nitride ($Li_xN_y$, $0<x<4$, and $0<y<2$), $SiS_2$-based glass ($Li_xSi_yS_z$, $0\leq x<3$, $0<y<2$, and $0<z<4$), $P_2S_5$-based glass ($Li_xP_yS_z$, $0<x<3$, $0<y<3$, and $0<z<7$), $Li_{3x}La_{2/3-x}TiO_3$ (wherein $0\leq x\leq 1/6$), $Li_7La_3Zr_2O_{12}$, $Li_{1+y}Al_yTi_{2-y}(PO_4)_3$ (wherein $0<y\leq 1$), $Li_{1+z}Al_zGe_{2-z}(PO_4)_3$ (wherein $0\leq z\leq 1$), $Li_2O$, LiF, LiOH, $Li_2CO_3$, $LiAlO_2$, $Li_2O$—$Al_2O_3$—$SiO_2$—$P_2O_5$—$TiO_2$—$GeO_2$-based ceramics, $Li_{10}GeP_2S_{12}$, $Li_{3.25}Ge_{0.25}P_{0.75}S_4$, $Li_3PS_4$, $Li_6PS_5Br$, $Li_6PS_5Cl$, $Li_7PS_5$, $Li_6PS_5I$, $Li_{1.3}Al_{0.3}Ti_{1.7}(PO_4)_3$, $LiTi_2(PO_4)_3$, $LiHf_2(PO_4)_3$, $LiZr_2(PO_4)_3$, $Li_3(NH_2)_2I$, $LiBH_4$, $LiAlH_4$, $LiNH_2$, $Li_{0.34}La_{0.51}TiO_{2.94}$, $LiSr_2Ti_2NbO_9$, $Li_{0.06}La_{0.66}Ti_{0.93}Al_{0.03}O_3$, $Li_{0.34}Nd_{0.55}TiO_3$, $Li_2CdCl_4$, $Li_2MgCl_4$, $Li_2ZnI_4$, $Li_2CdI_4$, $Li_{4.9}Ga_{0.5+\delta}La_3Zr_{1.7}W_{0.3}O_{12}$ (wherein $0\leq\delta<1.6$), $Li_{4.9}Ga_{0.5+\delta}La_3Zr_{1.7}W_{0.3}O_{12}$ (wherein $1.7\leq\delta\leq 2.5$), or $Li_{5.39}Ga_{0.5+\delta}La_3Zr_{1.7}W_{0.3}O_{12}$ (wherein $0\leq\delta<1.11$).

The inorganic lithium-ion conductor may be present in the form of a particle. The inorganic lithium-ion conductor may have an average particle diameter of about 5 nm to about 500 μm, for example, about 100 nm to about 15 μm, for example, about 300 nm to about 10 μm, and have a specific surface area of about 0.01 square meters per gram ($m^2/g$) to 1000 $m^2/g$, for example, about 0.5 $m^2/g$ to 100 $m^2/g$.

The solid electrolyte may have a double-layer structure including the second layer on the first layer, and thereby an amount of loss of the metal component and anions in the inorganic lithium-ion conductor of the first layer after impregnation in a saturated lithium hydroxide (LiOH) solution may be within 10% of the amount of metal component and an anion in the inorganic lithium-ion conductor of the first layer prior to exposure to a saturated LiOH solution.

In an embodiment, the solid electrolyte may have an ionic conductivity, after impregnation in a saturated lithium hydroxide solution, of about $1\times10^{-5}$ S/cm or greater, about $2\times10^{-5}$ S/cm or greater, about $3\times10^{-5}$ S/cm or greater, about $4\times10^{-5}$ S/cm or greater, about $5\times10^{-5}$ S/cm or greater, about $6\times10^{-5}$ S/cm or greater, about $7\times10^{-5}$ S/cm or greater, about $8\times10^{-5}$ S/cm or greater, about $9\times10^{-5}$ S/cm or greater, or about $1\times10^{-4}$ S/cm or greater. The solid electrolyte may have an ionic conductivity of, for example, about $1\times10^{-5}$ S/cm to about 1 S/cm, about $2\times10^{-5}$ S/cm to about 1 S/cm, about $4\times10^{-5}$ S/cm to about 1 S/cm, about $5\times10^{-5}$ S/cm to about 1 S/cm, about $1\times10^{-4}$ S/cm to about 1 S/cm, about $2\times10^{-4}$ S/cm to about 1 S/cm, about $2\times10^{-4}$ S/cm to about $5\times10^{-1}$ S/cm, or about $2\times10^{-4}$ S/cm to about $1\times10^{-1}$ S/cm, after exposure to a saturated lithium hydroxide solution. As such, the solid electrolyte may maintain an ionic conductivity even after exposure to a strong base. This indicates that the solid electrolyte has excellent stability in the presence of a strong base. As used herein, the terms "ionic conductivity after exposure to a saturated lithium hydroxide solution" means an ionic conductivity measured after the solid electrolyte is impregnated with a saturated lithium hydroxide solution and then maintained at 40° C. for 7 days.

The solid electrolyte according to an embodiment may have an ionic conductivity retention after exposure to a saturated lithium hydroxide (LiOH) solution of about 50% or greater, for example, about 56% or greater, for example, about 95% or greater, for example, about 100% or greater, for example, about 150% or greater, or for example, about 220% or greater. The ionic conductivity retention may be, for example, about 50% to about 300%, about 75% to about 250%, about 95% to about 200%, or about 100% to about 150%. The solid electrolyte has an ion conductivity after exposure to a saturated lithium hydroxide solution of 50% to 300% of an ion conductivity before the exposure to a saturated lithium hydroxide solution.

As used herein, an "ionic conductivity retention after exposure to a saturated lithium hydroxide (LiOH) solution" may be calculated using Equation 1.

Ionic conductivity retention (%)={Ionic conductivity after exposure to a saturated lithium hydroxide solution)/(Ionic conductivity before exposure to a saturated lithium hydroxide solution)}×100%    Equation 1

The solid electrolyte according to an embodiment may have an ionic conductivity at 25° C. of about $1\times10^{-6}$ S/cm or greater, about $2\times10^{-6}$ S/cm or greater, about $3\times10^{-6}$ S/cm or greater, about $4\times10^{-6}$ S/cm or greater, about $5\times10^{-6}$ S/cm or greater, about $6\times10^{-6}$ S/cm or greater, about $7\times10^{-6}$ S/cm or greater, about $8\times10^{-6}$ S/cm or greater, about $9\times10^{-6}$ S/cm or greater, about $1\times10^{-5}$ S/cm or greater, about $2\times10^{-5}$ S/cm or greater, about $3\times10^{-5}$ S/cm or greater, about $4\times10^{-5}$ S/cm or greater, about $5\times10^{-5}$ S/cm or greater, about $6\times10^{-5}$ S/cm or greater, about $7\times10^{-5}$ S/cm or greater, about $8\times10^{-5}$ S/cm or greater, about $9\times10^{-5}$ S/cm or greater, or about $1\times10^{-4}$ S/cm or greater. At a temperature of 25° C., the solid electrolyte may have, for example, an ion conductivity of about $1\times10^{-6}$ S/cm to about $1\times10^{2}$ S/cm, about $2\times10^{-6}$ S/cm to about $1\times10^{2}$ S/cm, about $2\times10^{-5}$ S/cm to about 10 S/cm, about $4\times10^{-5}$ S/cm to about 10 S/cm, about $4\times10^{-5}$ S/cm to about 5 S/cm, about $5\times10^{-5}$ S/cm to about 5 S/cm, about $1\times10^{-4}$ S/cm to about 1 S/cm, about $2\times10^{-4}$ S/cm to about 1 S/cm, about $4\times10^{-4}$ S/cm to about 1 S/cm, about $5\times10^{-4}$ S/cm to about 1 S/cm, about $1\times10^{-3}$ S/cm to about 1 S/cm, about $2\times10^{-3}$ S/cm to about 1 S/cm, about $2\times10^{-3}$ S/cm to about $5\times10^{-1}$ S/cm, or about $2\times10^{-3}$ S/cm to about $1\times10^{-1}$ S/cm. When the solid electrolyte has ionic conductivity within these ranges, a lithium-air battery including the solid electrolyte may have reduced internal resistance.

In analyzing the surface structure and components of the solid electrolyte according to an embodiment, for example, X-ray diffraction (XRD), scanning electron microscopy (SEM), transmission electron microscopy (TEM), inductively-coupled plasma (ICP) analysis, or X-ray photoelectron spectroscopy (XPS) may be used.

Hereinafter, embodiments of a method of preparing the solid electrolyte according to an embodiment will be described.

According to an aspect, a method of preparing the solid electrolyte comprises:

providing a first layer including an inorganic lithium-ion conductor;
depositing a compound represented by Formula 3 on at least one surface of the first layer to form a coating; and
heat-treating the coating on the least one surface of the first layer to form a second layer, wherein the second layer comprises at least one of a compound represented by Formula 1 or a compound represented by Formula 2.

$Li_sM_yO_z$    Formula 3 wherein, in Formula 3,
M is at least one of a monovalent element to a hexavalent element, and
0≤s<5, 0<y<5, and 0<z<5, $Li_xM_yO_z$    Formula 1

$Li_xM_y(OH)_z$    Formula 2 wherein, in Formulae 1 and 2,
each M is independently at least one of a monovalent element to a hexavalent element, and
each of x, y, and z are independently 0<x<5, 0<y<5, and 0<z<5.

In Formula 3, M may be the same as described above in connection with Formula 1. The compound represented by Formula 3 may be a Li-free metal oxide ($M_yO_z$).

The depositing of the compound represented by Formula 3 on at least one surface of the first layer including an inorganic lithium-ion conductor may be carried out using a method, for example, atomic layer deposition (ADL), physical vapor deposition (PVD), or sputtering, to form a coating.

Subsequently, by heat-treating the coating on the at least one surface of the first layer, a solid electrolyte including the compound represented by Formula 1 or Formula 2 may be formed.

The heat-treatment may be carried out, for example, under an oxidizing gas atmosphere or under an inert gas atmosphere. The oxidizing gas atmosphere may comprise, for example, air or oxygen, and the inert gas atmosphere may comprise nitrogen, argon, helium, or the like. Any suitable combination of these gases may be used.

In the heat-treatment, a temperature-increase rate may be, for example, 1° C./min to 10° C./min.

The heat-treatment temperature may be varied according to the deposition thickness of the coating or the type of compound included in the coated compound. For example, the thermal treatment temperature may be about 300° C. to about 1300° C. Particularly, the thermal treatment temperature may be, for example, about 400° C. to about 1200° C., about 500° C. to about 1100° C., about 600° C. to about 1000° C., about 600° C. to about 800° C., or about 600° C. to about 700° C. Within these temperature ranges, the compound of Formula 3 may be converted into the compound of Formula 1 or Formula 2 by lithium originating from the inorganic lithium-ion conductor being doped and/or mixed with the compound of Formula 3.

The solid electrolyte having a double-layer structure thus obtained may be chemically stable in the presence of alkalinity, and may have improved ionic conductivity based on reduced resistance in the solid electrolyte.

The solid electrolyte according to an embodiment may be used as an electrolyte of a metal-air battery, for example, a lithium-air battery. The solid electrolyte may be used also as an electrolyte of a lithium battery, for example, an all-solid battery.

According to an aspect, there is provided an electrochemical device including the solid electrolyte. When the electrochemical device comprises the solid electrolyte, which is chemically stable and has high ionic conductivity, the electrochemical device may have improved stability in the presence of moisture and a strong base, and deterioration of the electrochemical device may be inhibited.

The electrochemical device may be, for example, at least one of a battery, an accumulator, a supercapacitor, a fuel cell, a sensor, and an electrochromic device. However, embodiments are not limited thereto. Any suitable electrochemical device may be used.

The battery may be, for example, a primary battery or a secondary battery. The battery may be, for example, a lithium battery, a sodium battery, or the like. However, embodiments are not limited thereto, and any suitable battery may be used. The lithium battery may be, for example, a lithium-ion battery or a lithium-air battery. However, embodiments are not limited thereto. Any suitable lithium battery may be used. The electrochromic device may be an electrochemical mirror, a window, or a screen. However, embodiments are not limited thereto. Any suitable electrochromic device may be used.

The electrochemical device may be, for example, a lithium metal battery, or a lithium-air battery. The lithium-air battery may include a cathode. The cathode may be an air electrode, and may be arranged on a cathode current collector.

The cathode may be, for example, porous. When the cathode is porous, diffusion of air or oxygen into the cathode may be facilitated.

According to an aspect, a lithium-air battery may include a cathode, an anode, and an electrolyte interposed between the cathode and the anode, wherein the electrolyte includes the solid electrolyte according to an embodiment. Furthermore, at least one of the anode or the cathode may contain the solid electrolyte according to any of the above-described embodiments. The anode may comprise lithium.

When the solid electrolyte is included in the lithium-air battery according to an embodiment, the lithium-air battery may have improved stability in the presence of moisture and a strong base, and operate smoothly due to ensured reversibility under humidified or atmospheric conditions. The lithium-air battery may also have improved structural stability and deterioration thereof may be suppressed.

The lithium-air battery may include a cathode, and the cathode may be arranged, for example, on a cathode current collector.

The cathode may contain the solid electrolyte according to an embodiment. An amount of the solid electrolyte may be in a range of about 1 part by weight to about 100 parts by weight, for example, 10 parts by weight to 100 parts by weight, for example, 50 parts by weight to about 100 parts by weight, for example, about 60 parts by weight to about 100 parts by weight, for example, about 80 parts by weight to about 100 parts by weight, or for example, about 90 parts by weight to about 100 parts by weight, each with respect to 100 parts by weight of the cathode. For example, the cathode may substantially consist of the solid electrolyte. That is, the cathode may consist of a solid electrolyte having a double-layer structure including a first layer including an inorganic lithium-ion conductor and a second layer arranged on at least one surface of the first layer and including the compound represented by Formula 1 or Formula 2, as described above.

In manufacturing the cathode, pores may be introduced into the cathode by using a pore-forming agent. The cathode may be in the form of a porous pellet, a porous sheet, or the like. However, embodiments are not limited thereto. The cathode may have any suitable shape for the battery.

For example, the cathode may be pervious to gas such as oxygen, air, or the like. Accordingly, the cathode is distinguished from existing cathodes, which are substantially impervious to gas such as oxygen, air, or the like and only conduct ions. The cathode according to an embodiment may be porous and/or pervious to gas, and thus oxygen, air, or the like may be easily diffused into the cathode. In addition, lithium ions and/or electrons may also easily migrate through the solid electrolyte contained in the cathode. Accordingly, electrochemical reactions with oxygen, lithium ions, and electrons may be facilitated in the cathode.

In manufacturing the cathode, a suitable conductive material may be added, in addition to the solid electrolyte, to improve electronic conductivity and ionic conductivity. For example, the conductive material may be porous. Due to the porosity of the conductive material, air permeation may be facilitated. The conductive material may be any suitable material having porosity and/or conductivity. For example, the conductive material may be a carbonaceous material having porosity. The carbonaceous material may be, for example, carbon black, graphite, graphene, activated carbon, or carbon fiber. However, embodiments are not limited thereto. Any suitable carbonaceous material may be used. The conductive material may be, for example, a metallic material. For example, the metallic material may be a metal fiber, metal mesh, a metal powder, or the like. The metal powder may include, for example, copper, silver, nickel, or aluminum. The conductive material may be, for example, an organic conductive material. The organic conductive material may be, for example, polyphenylene derivatives, polythiophene derivatives, or the like. For example, the above-listed conductive materials may be used alone or in a combination thereof. The cathode may include a composite conductor as the common conductive material. The cathode may include any of the above-listed conductive materials, in addition to the composite conductor.

The cathode may comprise a catalyst for oxidation/reduction of oxygen. Examples of the catalyst may comprise at least one of a precious metal-based catalyst such as platinum, gold, silver, palladium, ruthenium, rhodium, or osmium, an oxide-based catalyst such as manganese oxide, iron oxide, cobalt oxide, or nickel oxide, or an organic metal-based catalyst such as cobalt phthalocyanine. However, embodiments are not limited thereto. Any suitable catalyst for oxidation/reduction of oxygen may be used.

The catalyst may be supported on a catalyst support. The catalyst support may be an oxide support, a zeolite support, a clay-based mineral support, a carbon support, or the like. The oxide support may be an oxide support including at least one of aluminum (Al), silicon (Si), zirconium (Zr), titanium (Ti), cerium (Ce), praseodymium (Pr), samarium (Sm), europium (Eu), terbium (Tb), thulium (Tm), ytterbium (Yb), antimony (Sb), bismuth (Bi), vanadium (V), chromium (Cr), manganese (Mn), iron (Fe), cobalt (Co), nickel (Ni), copper (Cu), niobium (Nb), molybdenum (Mo), or tungsten (W). Examples of the oxide support may comprise at least one of alumina, silica, zirconium oxide, or titanium dioxide. Examples of the carbon support may comprise at least one of carbon black such as Ketjen black, acetylene graphite, channel black, or lamp black; graphite such as natural graphite, artificial black, or expandable graphite; activated carbons; or carbon fibers. However, embodiments are not limited thereto. Any suitable catalyst support may be used.

The cathode may further comprise a binder. For example, the binder may comprise at least one of a thermoplastic resin or a thermocurable resin. For example, the binder may be at least one of polyethylene, polypropylene, polytetrafluoroethylene (PTFE), polyvinylidene fluoride (PVdF), styrene-butadiene rubber, a tetrafluoroethylene-perfluoroalkyl vinyl ether copolymer, a vinylidene fluoride-hexafluoropropylene copolymer, a vinylidene fluoride-chlorotrifluoroethylene copolymer, an ethylene-tetrafluoroethylene copolymer, polychlorotrifluoroethylene, a vinylidene fluoride-pentafluoropropylene copolymer, a propylene-tetrafluoroethylene copolymer, an ethylene-chlorotrifluoroethylene copolymer, a vinylidene fluoride-hexafluoropropylenetetrafluoroethylene copolymer, a vinylidene fluoride-perfluoromethyl vinyl ether-tetrafluoroethylene copolymer, or an ethylene-acrylic acid copolymer, which may be used alone or in a combination thereof. However, embodiments are not limited thereto. Any suitable binder may be used.

The cathode may be manufactured by mixing the metal oxide and optionally a conductive agent, a catalyst for oxidation/reduction of oxygen, and a binder together and adding an appropriate solvent thereto to prepare a cathode slurry. The cathode slurry is coated on a surface of a substrate and then dried on the surface of the substrate, or optionally the dried product is compression molded to improve an electrode density. For example, the substrate may be a cathode current collector, a separator, or a solid electrolyte membrane. For example, the cathode current collector may be a gas diffusion layer. The conductive agent may be, for example, a composite conductor. For example, the catalyst for oxidation/reduction of oxygen and the binder may be omitted depending of the type of cathode.

The lithium-air battery may include an anode. The anode may contain the solid electrolyte according to an embodiment.

The anode may comprise at least one of lithium or a lithium alloy.

The anode may be, for example, a lithium metal thin film or a lithium-based alloy thin film. The lithium-based alloy may be, for example, an alloy of lithium with at least one of aluminum, tin, magnesium, indium, calcium, titanium, or vanadium.

The lithium-air battery according an embodiment may include an electrolyte between the cathode and the anode.

The electrolyte may include the solid electrolyte according to an embodiment including a first layer including an inorganic lithium-ion conductor, and a second layer disposed on at least one surface of the first layer and including the compound represented by Formula 1 or Formula 2. As the second layer including the compound represented by Formula 1 or Formula 2 is arranged adjacent to the cathode or cathode current collector, the solid electrolyte may serve as an oxygen blocking film.

The electrolyte may comprise, in addition to the solid electrolyte, at least one of a solid electrolyte, a gel electrolyte, or a liquid electrolyte. The solid electrolyte, the gel electrolyte, and the liquid electrolyte are not specifically limited. Any suitable electrolyte may be used.

The solid electrolyte may comprise at least one of a solid electrolyte including an ionically conductive inorganic material, a solid electrolyte including a polymeric ionic liquid (PIL) and a lithium salt, a solid electrolyte including an ionically conductive polymer and a lithium salt, or a solid electrolyte including an electronically conductive polymer. However, embodiments are not limited thereto. Any suitable solid electrolyte may be used.

For example, the ionically conductive inorganic material may comprise at least one of a glass or amorphous metal ion conductor, a ceramic active metal ion conductor, or a glass ceramic active metal ion conductor. However, embodiments are not limited thereto. Any suitable ionically conductive inorganic material may be used. For example, the ionically conductive inorganic material may be ionically conductive inorganic particles or a molded product thereof, for example, in the form of a sheet.

For example, the ionically conductive inorganic material may be at least one of $BaTiO_3$, $Pb(Zr_aTi_{1-a})O_3$ (wherein $0 \leq a \leq 1$) (PZT), $Pb_{1-x}La_xZr_{1-y}Ti_yO_3$ (PLZT) (wherein $0 \leq x<1$ and $0 \leq y<1$), $Pb(Mg_{1/3}Nb_{2/3})O_3$—$PbTiO_3$ (PMN-PT), $HfO_2$, $SrTiO_3$, $SnO_2$, $CeO_2$, $Na_2O$, $MgO$, $NiO$, $CaO$, $BaO$, $ZnO$, $ZrO_2$, $Y_2O_3$, $Al_2O_3$, $TiO_2$, $SiO_2$, SiC, lithium phosphate ($Li_3PO_4$), lithium titanium phosphate ($Li_xTi_y(PO_4)_3$ (wherein $0<x<2$ and $0<y<3$), lithium aluminum titanium phosphate ($Li_xAl_yTi_z(PO_4)_3$) (wherein $0<x<2$, $0<y<1$, and $0<z<3$), $Li_{1+x+y}(Al_aGa_{1-a})_x(Ti_bGe_{1-b})_{2-x}Si_yP_{3-y}O_{12}$ (wherein $0 \leq x \leq 1$, $0 \leq y \leq 1$, $0 \leq a \leq 1$, and $0 \leq b \leq 1$), lithium lanthanum titanate ($Li_xLa_yTiO_3$, wherein $0<x<2$, and $0<y<3$), lithium germanium thio phosphate ($Li_xGe_yP_zS_w$, wherein $0<x<4$, $0<y<1$, $0<z<1$, and $0<w<5$), lithium nitride ($Li_xN_y$, wherein $0<x<4$, and $0<y<2$), $SiS_2$-based glass ($Li_xSi_yS_z$) (wherein $0<x<3$, $0<y<2$, and $0<z<4$), $P_2S_5$-based glass ($Li_xP_yS_z$) (wherein $0<x<3$, $0<y<3$, and $0<z<7$), a $Li_2O$-based ceramic, a LiF-based ceramic, a LiOH-based ceramic, a $Li_2CO_3$-based ceramic, a $LiAlO_2$-based ceramic, a $Li_2O$—$Al_2O_3$—$SiO_2$—$P_2O_5$—$TiO_2$—$GeO_2$-based ceramic, or a Garnet-based ceramic ($Li_{3+x}La_3M_2O_{12}$, wherein M is at least one of Te, Nb, or Zr, and $0 \leq x \leq 5$).

For example, the polymeric ionic liquid (PIL) may comprise: i) a cation of at least one of an ammonium-based cation, a pyrrolidinium-based cation, a pyridinium-based cation, a pyrimidinium-based cation, an imidazolium-based cation, a piperidinium-based cation, a pyrazolium-based cation, an oxazolium-based cation, a pyridazinium-based cation, a phosphonium-based cation, a sulfonium-based cation, or a triazolium-based cation; and ii) at least one of $BF_4^-$, $PF_6^-$, $AsF_6^-$, $SbF_6^-$, $AlCl_4^-$, $HSO_4^-$, $ClO_4^-$, $CH_3SO_3^-$, $CF_3CO_2^-$, $(CF_3SO_2)_2N^-$, $Cl^-$, $Br^-$, $I^-$, $SO_4^-$, $CF_3SO_3^-$, $(C_2F_5SO_2)(CF_3SO_2)N$—, $NO_3^-$, $Al_2Cl_7^-$, $CH_3COO^-$, $(CF_3SO_2)_3C^-$, $(CF_3CF_2SO_2)_2N^-$, $(CF_3)_2PF_4^-$, $(CF_3)_3PF_3^-$, $(CF_3)_4PF_2^-$, $(CF_3)_5PF^-$, $(CF_3)_6P^-$, $SF_5CF_2SO_3^-$, $SF_5CHFCF_2SO_3$—, $CF_3CF_2(CF_3)_2CO^-$, $(CF_3SO_2)_2CH^-$, $(SF_5)_3C^-$, or $(O(CF_3)_2C_2(CF_3)_2O)_2PO^-$. For example, the polymeric ionic liquid (PIL) may be poly(diallyldimethylammonium)bis(trifluoromethanesulfonyl)imide (TFSI), poly(1-allyl-3-methylimidazolium bis(trifluoromethanesulfonyl)imide), or poly((N-methyl-N-propylpiperidinium bis(trifluoromethanesulfonyl)imide.

The ionically conductive polymer may comprise at least one ion conductive repeating unit derived from an ether-based monomer, an acryl-based monomer, a methacryl-based monomer, or a siloxane-based monomer.

The ionically conductive polymer may comprise, for example, polyethylene oxide (PEO), polyvinyl alcohol (PVA), polyvinyl pyrrolidone (PVP), polyvinyl sulfone, polypropylene oxide (PPO), polymethylmethacrylate, polyethylmethacrylate, polydimethylsiloxane, polyacrylic acid, polymethacrylic acid, poly(methyl acrylate), poly(ethyl acrylate), poly(2-ethylhexyl acrylate), poly(butyl methacrylate), poly(2-ethylhexyl methacrylate), poly(decyl acrylate), polyethylene vinyl acetate, a phosphate ester polymer, polyester sulfide, polyvinylidene fluoride (PVdF), or Li-substituted Nafion. However, embodiments are not limited thereto. Any suitable ionically conductive polymer may be used.

The electronically conducting polymer may be, for example, a polyphenylene derivative or a polythiophene derivative. However, embodiments are not limited thereto. Any suitable electronically conducting polymer may be used.

In an embodiment, the gel electrolyte may be obtained, for example, by adding a low-molecular weight solvent to a solid electrolyte interposed between the cathode and the anode. The gel electrolyte may be a gel electrolyte obtained by adding a low-molecular weight organic compound such as a solvent, an oligomer, or the like to a polymer.

In an embodiment, the liquid electrolyte may comprise a solvent and a lithium salt.

The solvent may comprise at least one of an organic solvent, an ionic liquid (IL), or an oligomer. However, embodiments are not limited thereto. Any suitable solvent that is in liquid form at room temperature (25° C.) may be used.

The organic solvent may comprise, for example, at least one of an ether-based solvent, a carbonate-based solvent, an ester-based solvent, or a ketone-based solvent. For example, the organic solvent may comprise at least one of propylene carbonate, ethylene carbonate, fluoroethylene carbonate, vinylethylene carbonate, butylene carbonate, dimethyl carbonate, diethyl carbonate, methylethyl carbonate, methylpropyl carbonate, ethylpropyl carbonate, methylisopropyl carbonate, dipropyl carbonate, dibutyl carbonate, benzonitrile, acetonitrile, tetrahydrofuran, 2-methyltetrahydrofuran, γ-butyrolactone, dioxorane, 4-methyldioxorane, dimethyl acetamide, dimethylsulfoxide, dioxane, 1,2-dimethoxyethane, sulfolane, dichloroethane, chlorobenzene, nitrobenzene, succinonitrile, diethylene glycol dimethyl ether (DEGDME), tetraethylene glycol dimethyl ether (TEGDME), polyethylene glycol dimethyl ether (PEGDME, Mn=~500), dimethyl ether, diethyl ether, dibutyl ether, or dimethoxyethane (e.g., 1,2-dimethoxyethane). However, embodiments are not limited thereto. The organic solvent may be any suitable organic solvent that is in liquid form at room temperature.

The ionic liquid (IL) may comprise, for example, i) at least one of an ammonium-based cation, a pyrrolidinium-based cation, a pyridinium-based cation, a pyrimidinium-based cation, an imidazolium-based cation, a piperidinium-based cation, a pyrazolium-based cation, an oxazolium-based cation, a pyridazinium-based cation, a phosphonium-based cation, a sulfonium-based cation, or a triazolium-based cation, and ii) at least one of $BF_4^-$, $PF_6^-$, $AsF_6^-$, $SbF_6^-$, $AlCl_4^-$, $HSO_4^-$, $ClO_4^-$, $CH_3SO_3^-$, $CF_3CO_2^-$, $(CF_3SO_2)_2N^-$, $Cl^-$, $Br^-$, $I^-$, $SO_4^-$, $CF_3SO_3^-$, $(C_2F_5SO_2)_2N^-$, $(C_2F_5SO_2)(CF_3SO_2)N^-$, $NO_3^-$, $Al_2Cl_7^-$, $CH_3COO^-$, $(CF_3SO_2)_3C^-$, $(CF_3)_2PF_4^-$, $(CF_3)_3PF_3^-$, $(CF_3)_4PF_2^-$, $(CF_3)_5PF^-$, $(CF_3)_6P^-$, $SF_5CF_2SO_3^-$, $SF_5CHFCF_2SO_3^-$, $CF_3CF_2(CF_3)_2CO^-$, $(CF_3SO_2)_2CH^-$, $(SF_5)_3C^-$, or $(O(CF_3)_2C_2(CF_3)_2O)_2PO^-$.

The lithium salt may comprise at least one of lithium bis(trifluoromethanesulfonyl)imide ($LiN(SO_2CF_3)_2$, LiTFSI), $LiPF_6$, $LiBF_4$, $LiAsF_6$, $LiClO_4$, $LiNO_3$, lithium bis(oxalato) borate (LiBOB), $LiCF_3SO_3$, $LiN(SO_2C_2F_5)_2$, $LiN(SO_2F)_2$, $LiC(SO_2CF_3)_3$, $LiN(SO_3CF_3)_2$, $LiC_4F_9SO_3$, and $LiAlCl_4$. However, embodiments are not limited thereto. Any suitable lithium salt may be used. A concentration of the lithium salt may be, for example, about 0.01 M to about 5M, about 0.05 M to about 4.5 M, about 0.1 M to about 4 M, or about 1 M to about 3 M.

In an embodiment, the lithium-air battery may further include a separator between the cathode and the anode. Any separator may be used as long as the separator is durable under operating conditions of the lithium-air battery. For example, the separator may include a polymer non-woven fabric, for example, a non-woven fabric of polypropylene material or a non-woven fabric of polyphenylene sulfide; a porous film of an olefin resin such as polyethylene or polypropylene; or glass fiber. Two or more separators may be used in combination.

For example, the electrolyte may have a structure in which a solid polymer electrolyte is impregnated in the separator, or a structure in which a liquid electrolyte is impregnated in the separator. For example, the electrolyte in which a solid polymer electrolyte is impregnated in the separator may be prepared by arranging solid polymer electrolyte films on opposite surfaces of the separator, and roll-pressing them at the same time. For example, the electrolyte in which a liquid electrolyte is impregnated in the separator may be prepared by injecting a liquid electrolyte including a lithium salt into the separator.

In an embodiment, the lithium-air battery may be manufactured by installing the anode on an inner side of a case, sequentially arranging the electrolyte on the anode, the cathode on the electrolyte, and a porous cathode current collector on the cathode, and then arranging a pressing member on the porous cathode current collector to press a resulting cell structure with the pressing member, which allows air to be transferred to the air electrode (i.e., cathode). The case may be divided into upper and lower portions which contact the anode and the air electrode, respectively. An insulating resin may be disposed between the upper and lower portions of the case to electrically insulate the cathode and the anode from one another.

The lithium-air battery may be used as a lithium primary battery or a lithium secondary battery. The shape of the lithium-air battery may be, for example, a coin, a button, a sheet, a stack, a cylinder, a plane, or a horn. However, embodiments are not limited thereto. The lithium-air battery may be used in a large battery for an electric vehicle.

Figure 2:
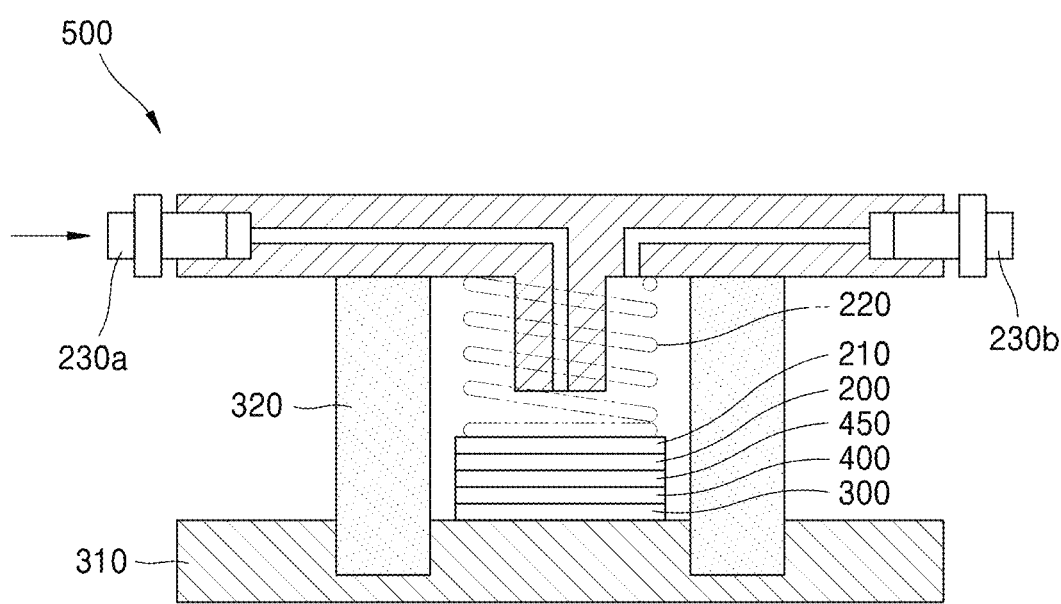
FIG. 2 is a schematic view illustrating a structure of an embodiment of a lithium-air battery.

FIG. 2 is a schematic view illustrating a structure of an embodiment of a lithium-air battery 500.

Referring to FIG. 2, the lithium-air battery 500 according to an embodiment may include a cathode 200 adjacent to a first current collector 210 and using oxygen as an active material, an anode 300 adjacent to a second current collector 310 and including lithium, and a first electrolyte 400 interposed between the cathode 200 and the anode 300. The first electrolyte 400 may be a separator impregnated with a liquid electrolyte.

A second electrolyte 450 may be arranged between the cathode 200 and the first electrolyte 400. The second electrolyte 450 may be a solid electrolyte according to an embodiment. The second layer of the solid electrolyte including the compound represented by Formula 1 or 2 may be arranged adjacent to the cathode 200. The first current collector 210 may function as a gas diffusion layer which is porous to allow diffusion of air. A pressing member 220 for transporting air to the cathode 200 may be arranged on the first current collector 210.

The anode 300 is electrically connected to a lower plate (not shown) of a case 320, and the cathode 200 is electrically connected to an upper plate (not shown) of the case 320. The case 320 made of an insulating resin may be disposed between the cathode 200 and the anode 300. The case 320 electrically separates the upper plate from the lower plate, and thus insulates the cathode 200 and the anode 300 from one another. The air may be supplied into the lithium-air battery 500 through an air inlet 230a and may be discharged through an air outlet 230b. The lithium-air battery 500 may be prepared in a stainless steel container.

The term "air" used herein is not limited to atmospheric air, and for convenience, may refer to a combination of gases including oxygen, or pure oxygen gas. This broad definition of the term "air" also applies to any other terms used herein, including "air battery" and "air electrode."

The lithium-air battery may be useful in any fields in which secondary batteries are applied.

The present disclosure will now be described in detail with reference to the following examples. However, these examples are only for illustrative purposes and are not intended to limit the scope of the one or more embodiments of the present disclosure.

EXAMPLES

Preparation of Solid Electrolyte

Comparative Example 1: LATP

As a control group for confirmation of coating and heat-treatment effects, a LATP solid electrolyte (Ohara Inc., LICGC, Thickness: 250 μm) having the composition of $Li_2O$—$Al_2O_3$—$SiO_2$—$P_2O_5$—$TiO_2$ was used as Comparative Example 1.

Comparative Example 2: ZnO-Coated LATP

ZnO was coated on a surface of the LATP solid electrolyte of Comparative Example 1 to a thickness of about 10 nm by using atomic layer deposition (ALD).

This ZnO-coated LATP solid electrolyte, which was not heat-treated, was used as Comparative Example 2.

Example 1: $Li_{0.5}Zn_{0.75}O$-Coated LATP

The ZnO-coated LATP solid electrolyte of Comparative Example 2 was heated to 600° C. at a temperature-increase rate of 5° C./min and heat-treated under atmospheric condition for 4 hours to prepare a $Li_{0.5}Zn_{0.75}O$-coated LATP solid electrolyte.

Example 2: $Li_{0.6}Zn_{0.7}O$-Coated LATP

The ZnO-coated LATP solid electrolyte of Comparative Example 2 was heated to 700° C. at a temperature-increase rate of 5° C./min and heat-treated under atmospheric conditions for 4 hours to prepare a $Li_{0.6}Zn_{0.7}O$-coated LATP solid electrolyte.

Comparative Example 3: $TiO_2$-Coated LATP $TiO_2$ was coated on a surface of the LATP solid electrolyte of Comparative Example 1 to a thickness of about 10 nm by using atomic layer deposition (ALD).

This $TiO_2$-coated LATP solid electrolyte, which was not heat-treated, was used as Comparative Example 3.

Example 3: $Li_{0.4}Ti_{0.8}O_2$-Coated LATP

The $TiO_2$-coated LATP solid electrolyte of Comparative Example 3 was heated to 600° C. at a temperature-increase rate of about 5° C./min and heat-treated under atmospheric conditions for 4 hours to prepare a $Li_{0.4}Ti_{0.8}O_2$-coated LATP solid electrolyte.

Example 4: $Li_{0.8}Ti_{0.8}O_2$-Coated LATP

The $TiO_2$-coated LATP solid electrolyte of Comparative Example 3 was heated to 700° C. at a temperature-increase rate of about 5° C. /min and heat-treated under atmospheric conditions for 4 hours to prepare a $Li_{0.8}Ti_{0.8}O_2$-coated LATP solid electrolyte.

Comparative Manufacture Example 1: Manufacture of Lithium-Air Battery

After 40 parts by weight of carbon (Super-P), 10 parts by weight of polytetrafluoroethylene (PTFE), and 50 parts by weight of N-methylpyrrolidone (NMP) were mixed to prepare a cathode slurry, the slurry was coated and pressed to obtain a cathode mixture sheet. The cathode mixture sheet was pressed on a stainless steel mesh, and then vacuum-dried in a 100° C.—oven for 120 minutes to obtain a cathode.

An opening having a size of 1 cm×1 cm was made at the center of a polypropylene coated aluminum film (Thickness: 200 μm) having a size of 5 cm×5 cm, and then the opening was blocked with the solid electrolyte of Comparative Example 1 in a size of 1.4 cm×1.4 cm using an adhesive, to thereby prepare a first aluminum film partially consisting of the solid electrolyte of Comparative Example 1. Next, a second aluminum film having a size of 5 cm×5 cm, a copper current collector (Thickness: 20 μm), a lithium foil (1.4 cm×1.4 cm, Thickness: 100 μm), a Celgard-3501 separator (available from Celgard) having a thickness of 25 μm, made of polypropylene and impregnated with an electrolyte solution as a mixture of 1M LiTFSI and PC (propylene carbonate), and the first aluminum film prepared above were stacked on one another and then adhered to each other by heating under vacuum, to thereby obtain an aluminum pouch type, protected lithium anode.

The protected lithium anode was installed in a stainless steel case, and a cathode with a Celgard-3501 separator (available from Celgard) having a thickness of 25 μm, made of polypropylene, on a side facing the anode was set therein. Subsequently, a gas diffusion layer made of carbon fiber was arranged on the cathode, and then foamed nickel plate was arranged thereon, and the resulting structure was then pressed with a pressing member for transporting air to the cathode to thereby manufacture a lithium-air battery.

Comparative Manufacture Example 2: Manufacture of Lithium-Air Battery

A lithium-air battery was manufactured in the same manner as in Comparative Manufacture Example 1, except that the solid electrolyte of Comparative Example 2 was used instead of the solid electrolyte of Comparative Example 1, and ZnO is adjacent to the cathode.

Manufacture Example 1: Manufacture of Lithium-Air Battery

A lithium-air battery was manufactured in the same manner as in Comparative Manufacture Example 1, except that the solid electrolyte of Example 1 was used instead of the solid electrolyte of Comparative Example 1, and $Li_xZnO$ is adjacent to the cathode.

Manufacture Example 2: Manufacture of Lithium-Air Battery

A lithium-air battery was manufactured in the same manner as in Comparative Manufacture Example 1, except that the solid electrolyte of Example 2 was used instead of the solid electrolyte of Comparative Example 1, and $Li_xZnO$ is adjacent to the cathode.

Comparative Manufacture Example 3: Manufacture of Lithium-Air Battery

A lithium-air battery was manufactured in the same manner as in Comparative Manufacture Example 1, except that the solid electrolyte of Comparative Example 3 was used instead of the solid electrolyte of Comparative Example 1, and $TiO_2$ is adjacent to the cathode.

Manufacture Example 3: Manufacture of Lithium-Air Battery

A lithium-air battery was manufactured in the same manner as in Comparative Manufacture Example 1, except that the solid electrolyte of Example 3 was used instead of the solid electrolyte of Comparative Example 1, and $Li_xTiO_2$ is adjacent to the cathode.

Manufacture Example 4: Manufacture of Lithium-Air Battery

A lithium-air battery was manufactured in the same manner as in Comparative Manufacture Example 1, except that the solid electrolyte of Example 4 was used instead of the solid electrolyte of Comparative Example 1, and $Li_xTiO_2$ is adjacent to the cathode.

Evaluation Example 1: Evaluation of Solid Electrolyte Surface Composition

Figure 5A:
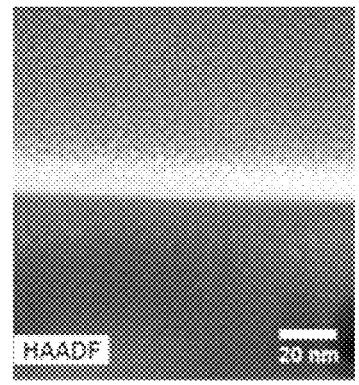
FIGS. 5A, 5B, and 5C show the results of high-angle annular dark-field scanning transmission electron microscopy (HAADF-STEM) and energy dispersive X-ray spectroscopy (EDS) analysis of a cross-section of the solid electrolyte prepared in Example 1.
Figure 5B:
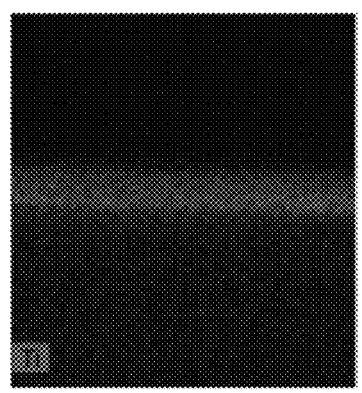
Figure 5C:
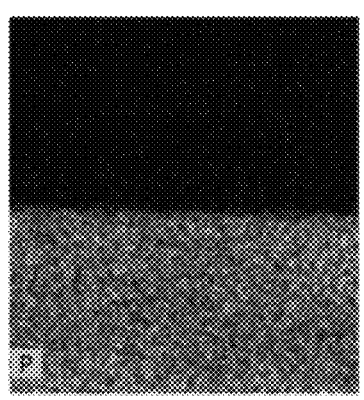

FIGS. 5A, 5B, and 5C show high-angle annular dark field scanning transmission electron microscopy (HAADF-STEM) and energy dispersive X-ray spectroscopy (EDS) images of a cross-section of the solid electrolyte prepared in Example 1.

As shown in FIGS. 5B and 5C, the solid electrolyte of Example 1 was found to have a Ti-containing coating layer with a thickness of about 10 nm on a surface of the LATP including phosphorous (P) element.

Figure 6:
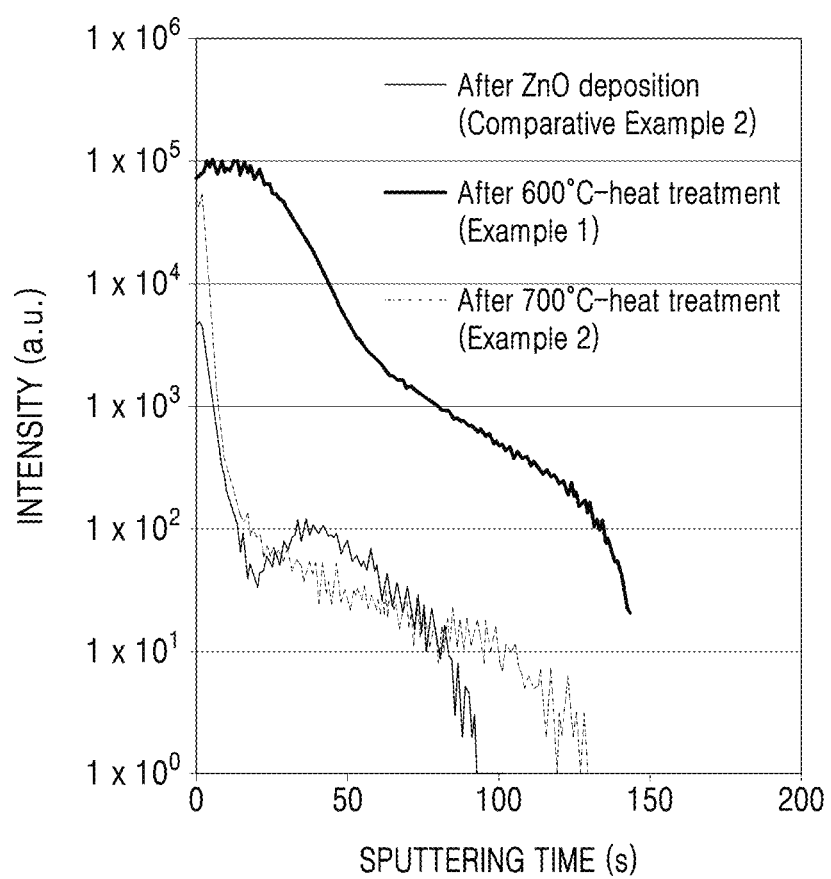
FIG. 6 is a graph of intensity (arbitrary units (a.u.)) versus sputtering time (seconds (s)) and illustrates the results of time-of-flight secondary ion mass spectrometry (ToF-SIMS) analysis of lithium (Li) ions on the surface of the solid electrolyte of Comparative Example 2 and Examples 1 and 2.

FIG. 6 illustrates the analysis results of time-of-flight secondary ion mass spectrometry (ToF-SIMS) on lithium (Li) ions on the surfaces of the solid electrolytes of Comparative Example 2 and Examples 1 and 2.

As shown in FIG. 6, as diffusion of Li ions into the ZnO layer occurs based on the temperature of the heat-treatment performed after the ALD of ZnO, the ZnO layer was doped with Li and had an increased Li content.

Figure 7:
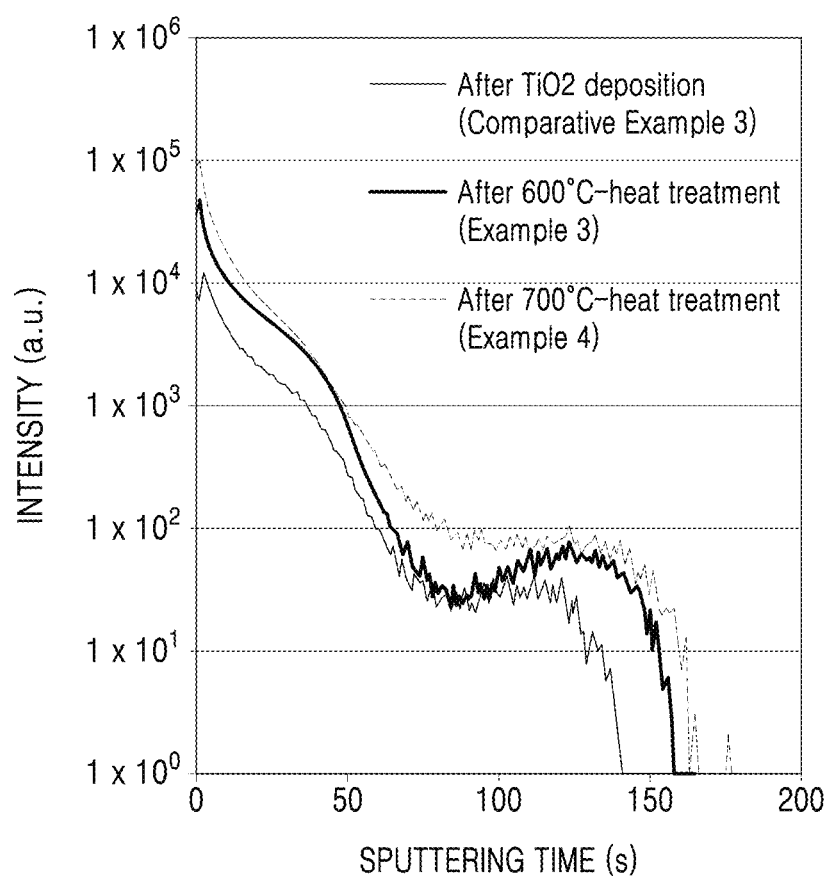
FIG. 7 is a graph of intensity (arbitrary units (a.u.)) versus sputtering time (seconds (s)) and illustrates the results of ToF-SIMS analysis of Li ions on the surface of the solid electrolytes of Comparative Example 3 and Examples 3 and 4.

FIG. 7 illustrates the analysis results of ToF-SIMS on Li ions on the surfaces of the solid electrolytes of Comparative Example 3 and Examples 3 and 4.

As shown in FIG. 7, as diffusion of Li ions into the $TiO_2$ layer occurs based on the temperature of the heat-treatment performed after the ALD of $TiO_2$, the $TiO_2$ layer was doped with Li and had an increased Li content.

Evaluation Example 2: Ionic Conductivity Evaluation

Gold (Au) was deposited on the upper and lower surfaces of each of the solid electrolytes prepared in Comparative Examples 1 to 3 and Examples 1 to 4 by sputtering, and the impedance of each sample was measured by a 2-probe method using an impedance analyzer. A frequency range was from 1 Hz to 1 MHz, and an amplitude voltage was 100 mV. The impedance was measured at 30° C. in an air atmosphere. Resistance values were obtained from an arc of a Nyquist plot for the impedance measurement results. The results are shown in FIG. 8.

Figure 8:
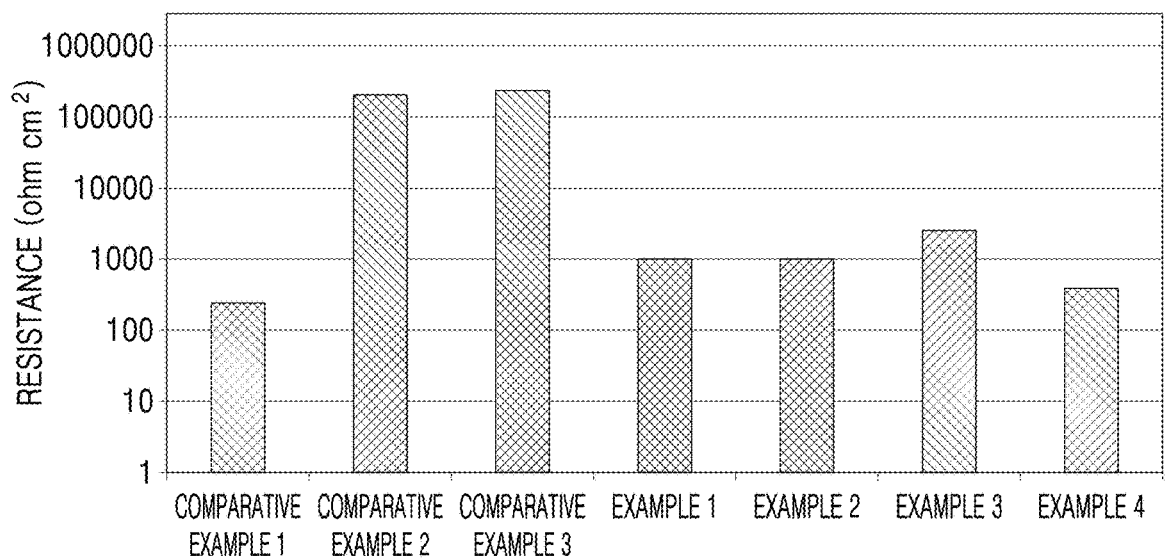
FIG. 8 is a graph illustrating the results of resistance analysis of the solid electrolytes prepared in Comparative Examples 1 to 3 and Examples 1 to 4.

As shown in FIG. 8, the solid electrolytes prepared in Examples 1 to 4 were found to have a reduced resistance as compared with the resistance of the solid electrolyte of Comparative Example 2 or Comparative Example 3. From these results, it was found that due to the change of ZnO or $TiO_2$ into doped $Li_xZnO$ and $Li_xTiO_2$ through heat treatment after ZnO or $TiO_2$ deposition, the solid electrolytes prepared in Examples 1 to 4 had improved ionic conductivity as compared with a metal oxide not doped with lithium.

After the solid electrolytes prepared in Comparative Example 1 and Examples 1 to 4 were impregnated with a saturated lithium hydroxide (LiOH) aqueous solution and left at 40° C. for one week, resistance values thereof were measured according to the same method as above. The results comparing the resistance values before and after being left in LiOH are shown in FIG. 9.

Figure 9:
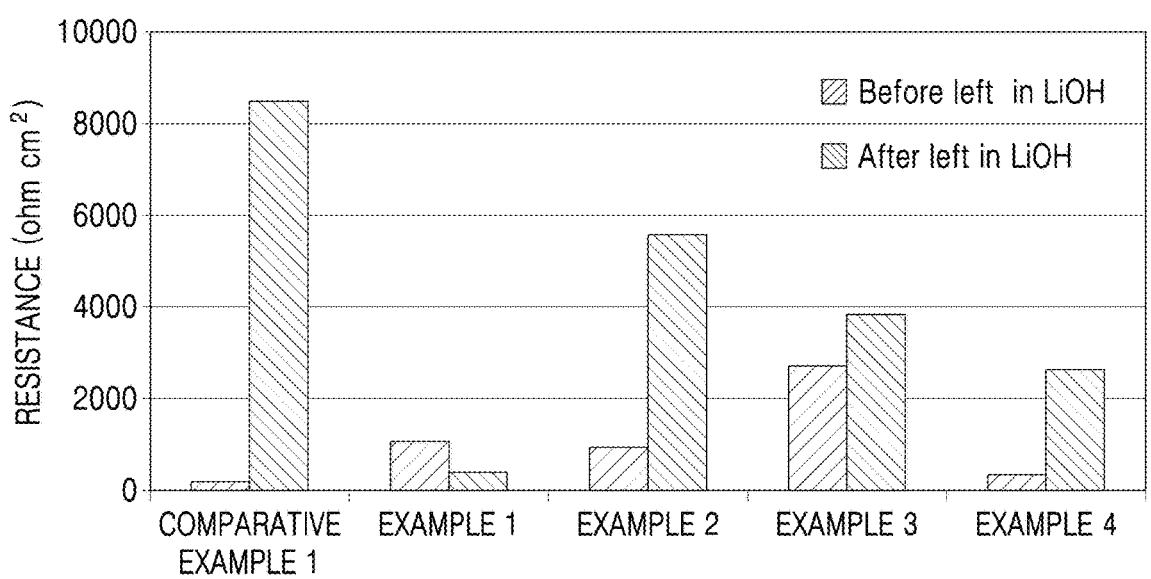
FIG. 9 is a comparative graph of the results of resistance analysis of the solid electrolytes prepared in Comparative Example 1 and Examples 1 to 4, before and after exposure to a saturated lithium hydroxide (LiOH) solution.

As shown in FIG. 9, the solid electrolytes prepared in Examples 1 to 4 were found not to have a significant reduction or increase in resistance after exposure to the lithium hydroxide solution, as compared with the solid electrolyte of Comparative Example 1. From these results, it was confirmed that the solid electrolytes of Examples 1 to 4 had improved stability in the presence of moisture and strong base by using a coating of $Li_xZnO$ and $Li_xTiO_2$, as compared with the LATP solid electrolyte of Comparative Example 1.

Evaluation Example 3: Surface Layer Composition Evaluation after being Left in LiOH After the solid electrolytes prepared in Comparative Example 1 and Examples 1 and 3 were impregnated with the saturated lithium hydroxide (LiOH) aqueous solution and then left at 40° C. for one week, the surface layer composition of each solid electrolyte was observed through scanning electron microscopy-energy dispersive spectroscopy (SEM-EDS).

Figure 10A:
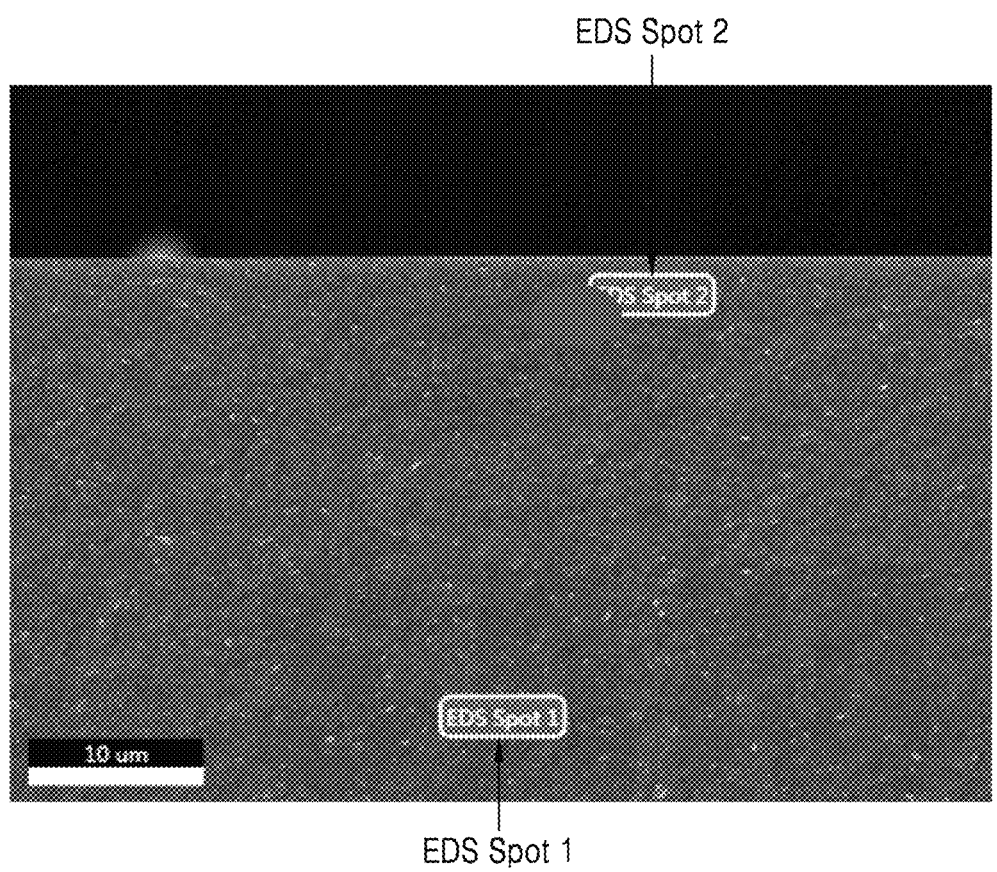
FIGS. 10A and 10B illustrate the results of SEM-EDS analysis of the solid electrolyte of Comparative Example 1 before exposure to a saturated LiOH solution.
Figure 10B:
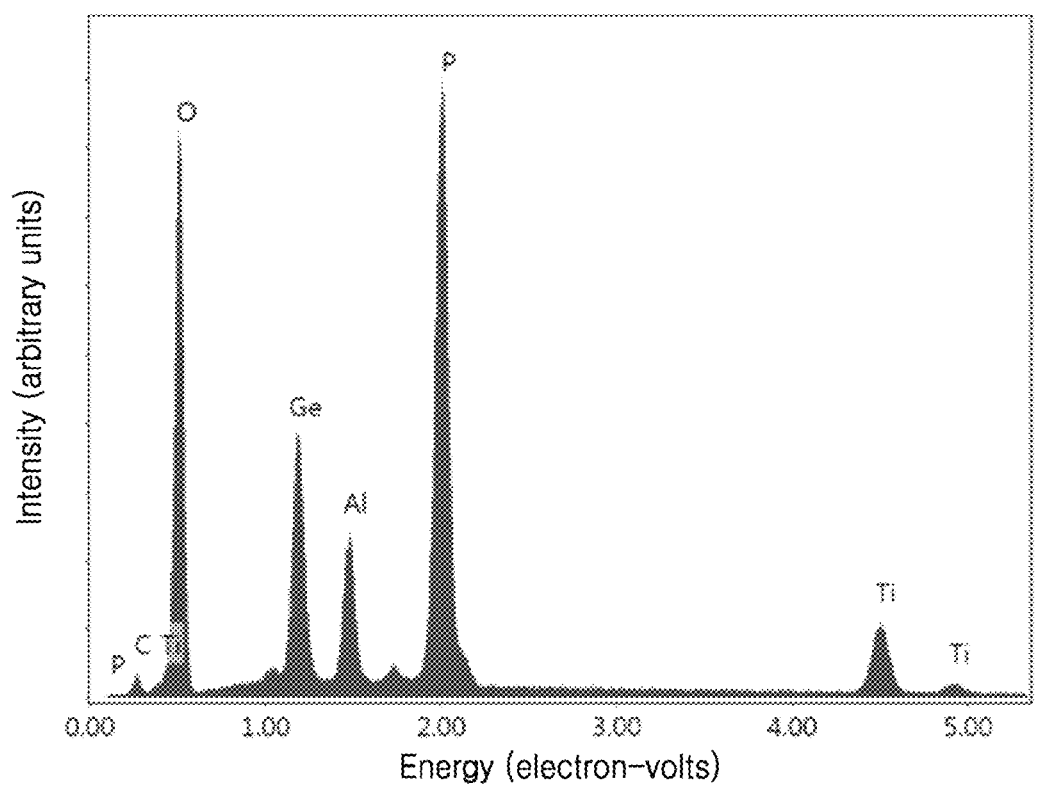
Figure 11A:
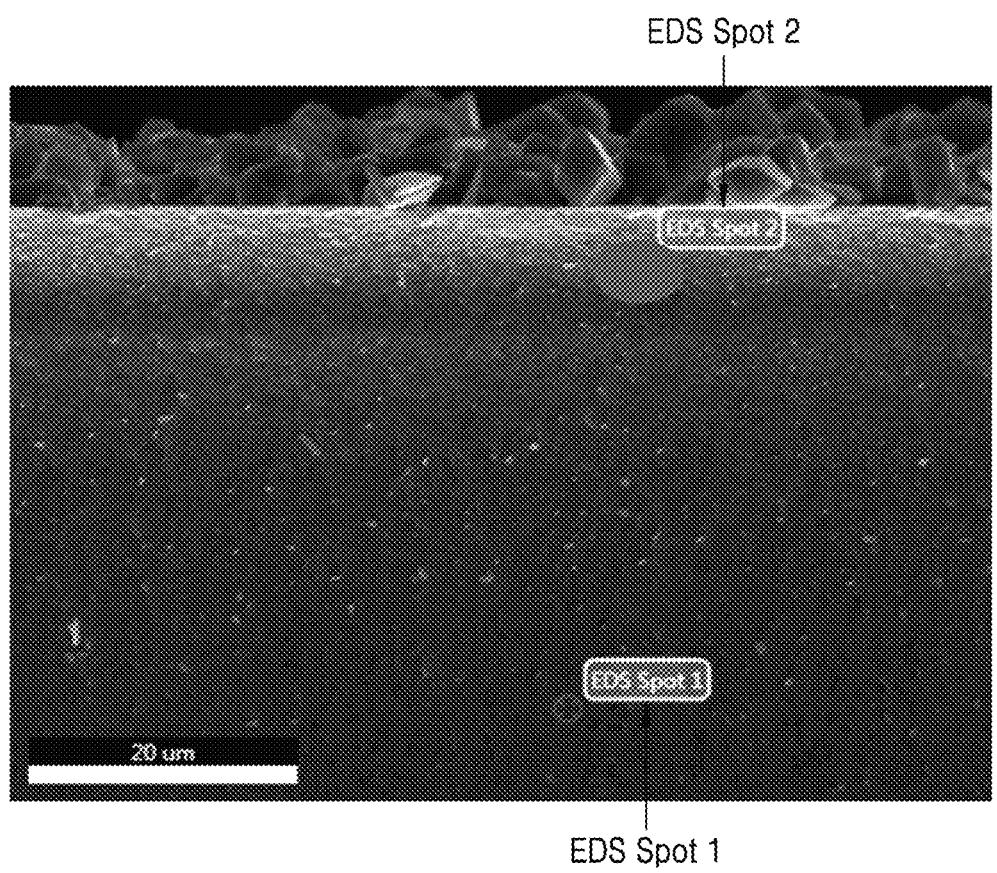
FIGS. 11A and 11B illustrate the results of SEM-EDS analysis of the solid electrolyte of Comparative Example 1 after exposure to a saturated LiOH solution.
Figure 11B:
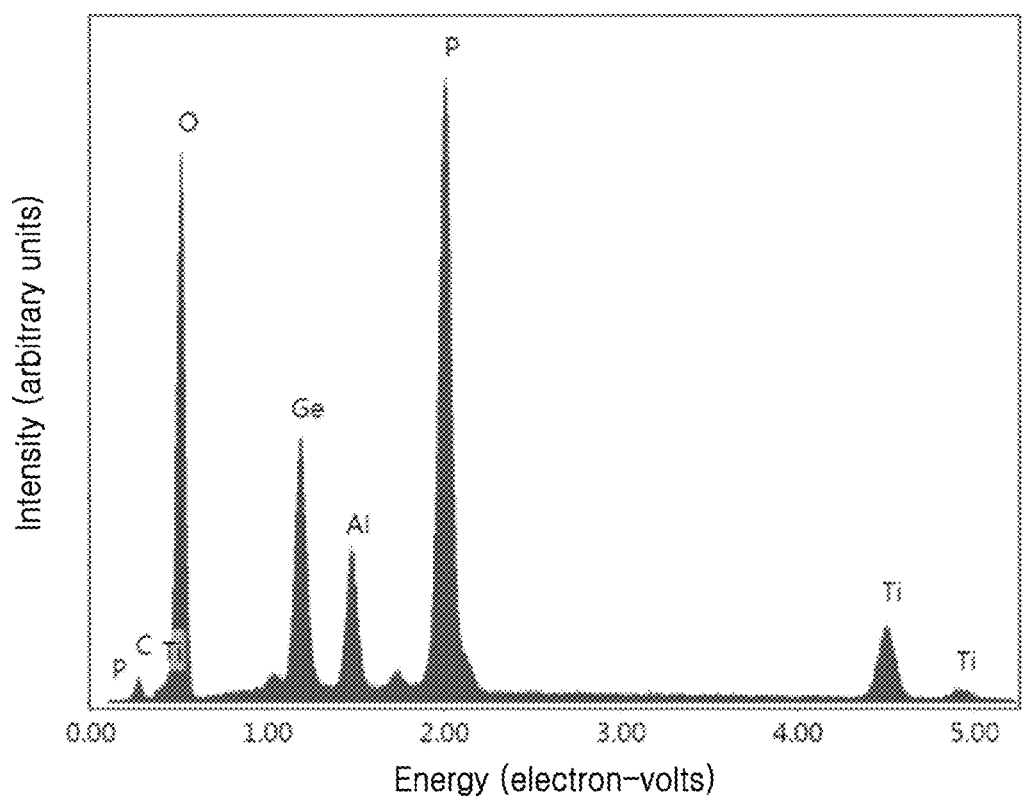
Figure 12A:
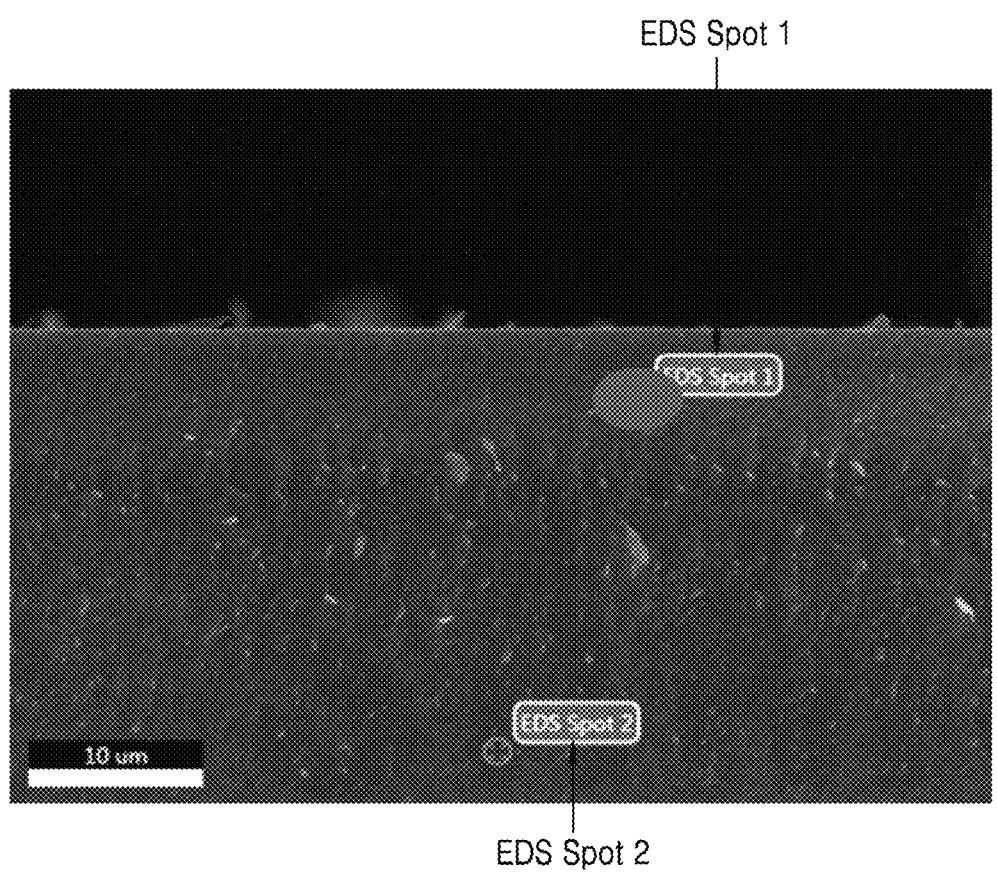
FIGS. 12A and 12B illustrate the results of SEM-EDS analysis of the solid electrolyte of Example 1 after exposure to a saturated LiOH solution.
Figure 12B:
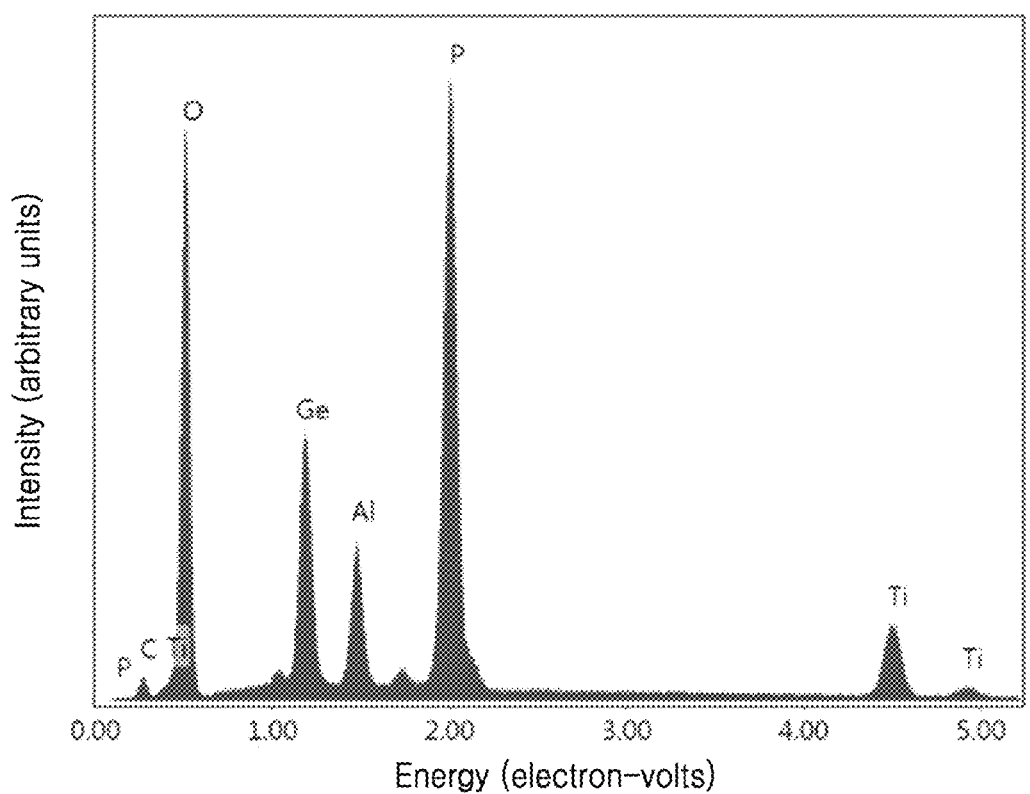
Figure 13A:
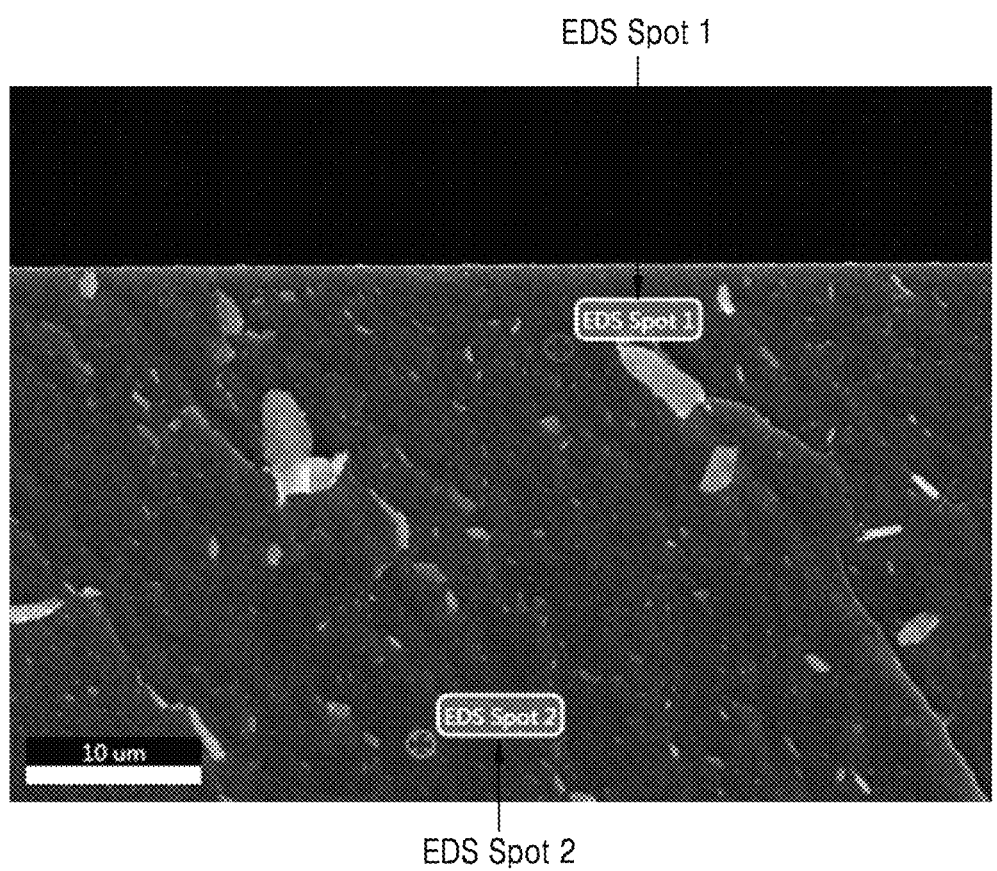
FIGS. 13A and 13B illustrate the results of SEM-EDS analysis of the solid electrolyte of Example 3 after exposure to a saturated LiOH solution.
Figure 13B:
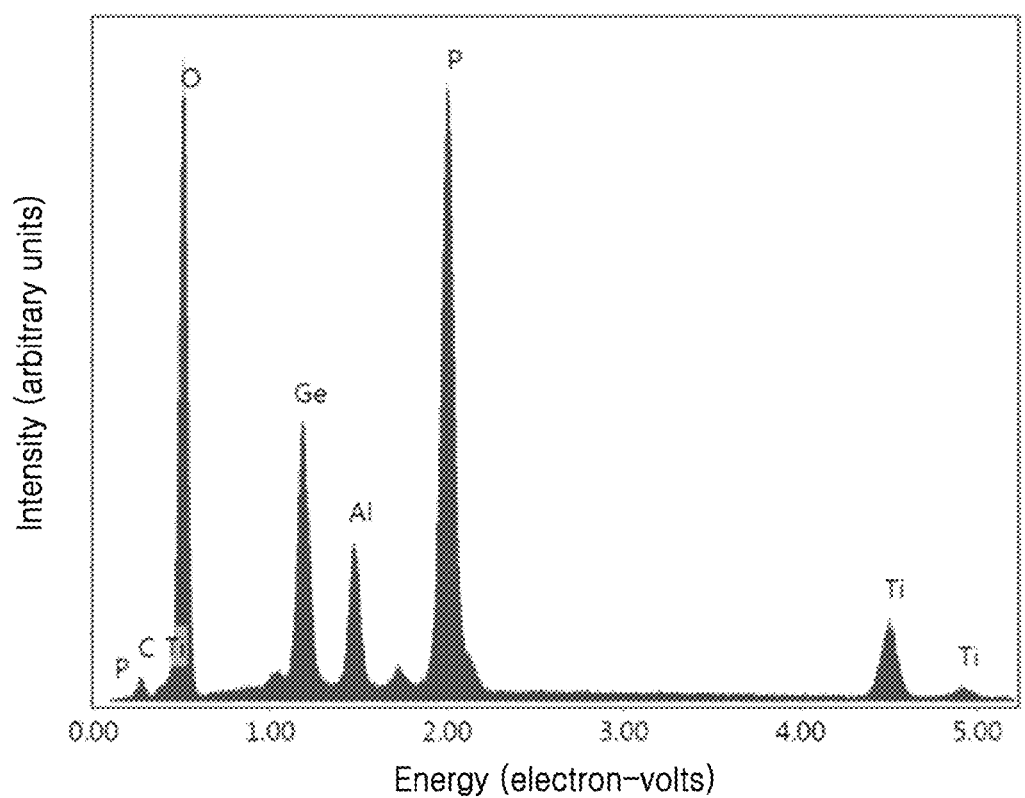

FIGS. 10A and 10B illustrate the results of SEM-EDS of the solid electrolyte of Comparative Example 1 before exposure to LiOH, and FIGS. 11A and 11B illustrate the results of SEM-EDS on the solid electrolyte of Comparative Example 1 after being left in LiOH. FIGS. 12A and 12B illustrate the results of SEM-EDS on the solid electrolyte of Example 1 after being left in LiOH, and FIGS. 13A and 13B illustrate the results of SEM-EDS on the solid electrolyte of Example 3 after being left in LiOH.

As shown in FIGS. 10A to 13B, it was found that the $Li_xZnO$ and $Li_xTiO_2$ coatings in the solid electrolytes prepared in Examples 1 and 3 were maintained stable even after being left in LiOH.

Figure 14:
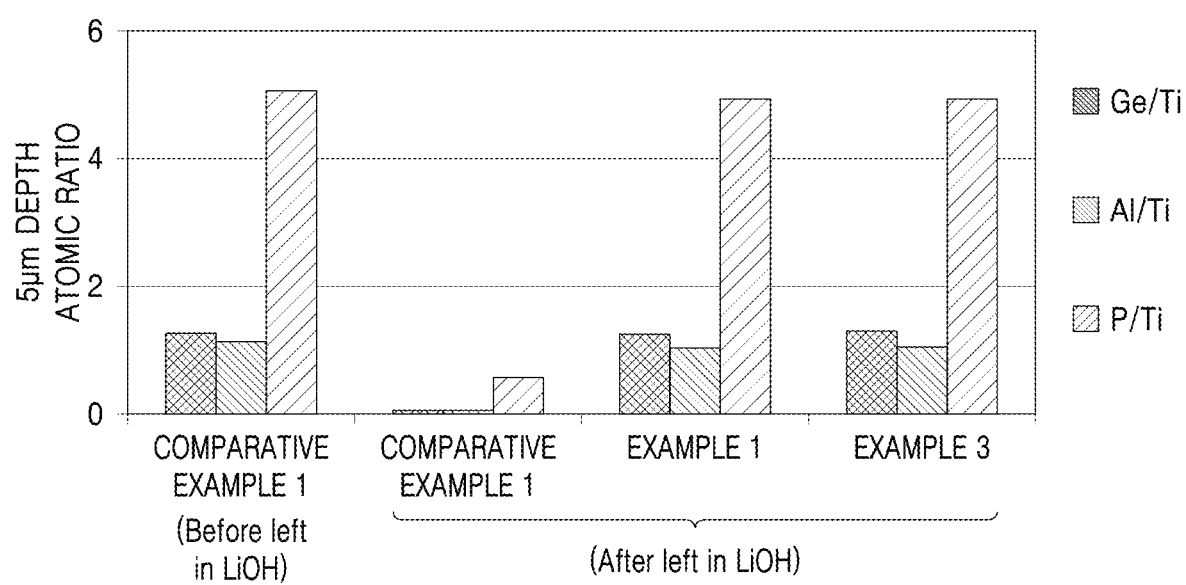
FIG. 14 is a graph illustrating the results of comparison of Ge/Ti, Al/Ti, and P/Ti atomic ratios at a 5 micrometer (μm) depth, when measured using X-ray photoelectron spectroscopy, in each of the solid electrolytes of Comparative Example 1 and Examples 1 and 3 after exposure to a saturated LiOH solution, with those of the solid electrolyte of Comparative Example 1 before exposure to a saturated LiOH solution.

In addition, Ge/Ti, Al/Ti, and P/Ti ratios by atomic % at a 5-μm depth in each of the solid electrolytes of Comparative Example 1 and Examples 1 and 3 after being left in LiOH were compared with those of the solid electrolyte of Comparative Example 1 before exposure to LiOH, and the comparison results are shown in FIG. 14. For reference, since Ti does not dissolve well, the ratios by atomic % of Ge, Al, and P with respect to Ti were used for the solubility comparison of each of the components.

As shown in FIG. 14, it is found that in the solid electrolytes prepared in Examples 1 and 3, the elements Ge, Al, and P of LATP did not dissolve after being left in LiOH, due to the coating with $Li_xZnO$ and $Li_xTiO_2$. Meanwhile, in the LATP solid electrolyte of Comparative Example 1, it was found that, when there was no coating, the elements Ge, Al, and P of LATP mostly dissolved after exposure to LiOH.

Evaluation Example 4: Evaluation of Charge-Discharge Characteristics of Lithium-Air Battery The lithium-air batteries manufactured in Manufacture Examples 1 to 4 were subjected to a charge-discharge cycle of discharging at about 60° C. under an oxygen atmosphere of about 1 atm and a 100% humidity with a constant current of about 0.01 mA/cm$^2$ until a voltage reached 2.0 V (with respect to Li) and then charging with a constant current of about 0.01 mA/cm$^2$ until a voltage reached 4.25 V. The results of the charge-discharge test at the 1$^{st}$ cycle of each lithium-air battery were analyzed.

As a result of the charge-discharge test, the lithium-air batteries of Manufacture Examples 1 to 4 using the solid electrolytes of Examples 1 to 4, respectively, were confirmed to operate stably.

As described above, according to an embodiment, the solid electrolyte may have significantly improved stability to basic environments, and thus provide improved ionic conductivity. A secondary battery having improved lifespan characteristics may be manufactured using the solid electrolyte.

It should be understood that embodiments described herein should be considered in a descriptive sense only and not for purposes of limitation. Descriptions of features, aspects, or advantages within each embodiment should be considered as available for other similar features, aspects, or advantages in other embodiments. While one or more embodiments have been described with reference to the figures, it will be understood by those of ordinary skill in the art that various changes in form and details may be made therein without departing from the spirit and scope as defined by the following claims.

What is claimed is:

1. A solid electrolyte comprising:
   a first layer comprising an inorganic lithium-ion conductor; and
   a second layer disposed on at least one surface of the first layer, wherein the second layer comprises at least one of $Li_xZn_{(1-x/2)}O$ or $Li_xZn_{(1-x/2)}(OH)_2$, where $0<x<5$, or $Li_xTi_{(1-x/4)}O_2$, where $0<x\le1$.

2. The solid electrolyte of claim 1, wherein the at least one of $Li_xZn_{(1-x/2)}O$ and $Li_xZn_{(1-x/2)}(OH)_2$ is $0<x\le4$.

3. The solid electrolyte of claim 1, wherein a portion of a surface of the second layer comprises a hydroxide.

4. The solid electrolyte of claim 1, wherein the second layer has a thickness of about 1 nanometer to about 30 micrometers.

5. The solid electrolyte of claim 1, wherein the inorganic lithium-ion conductor comprises at least one of
   doped garnet-based ceramics $Li_{3+x}La_3M_2O_{12}$, wherein $0\le x\le5$, M is at least one of W, Ta, Te, Nb, and Zr, and a dopant is at least one of Ge, Ta, Nb, Al, Ga, Sc, $Li_{1+x+y}Al_xTi_{2-x}Si_yP_{3-y}O_{12}$, wherein $0<x<2$, and $0\le y<3$, $BaTiO_3$, $Pb(Zr_aTi_{1-a})O_3$, wherein $0\le a\le 1$, $Pb_{1-x}La_xZr_{1-y}Ti_yO_3$, wherein $0\le x<1$, and $0\le y<1$, $Pb(Mg_{1/3}Nb_{2/3})O_3$—$PbTiO_3$, $Li_3PO_4$, $Li_xTi_y(PO_4)_3$, wherein $0<x<2$, and $0<y<3$, $Li_xAl_yTi_z(PO_4)_3$, wherein $0<x<2$, $0<y<1$, and $0<z<3$, $Li_{1+x+y}(Al_aGa_{1-a})_x(Ti_bGe_{1-b})_{2-x}Si_yP_{3-y}O_{12}$, wherein $0\le x\le1$, $0\le y\le1$, $0\le a\le1$, and $0\le b\le1$ $Li_xLa_yTiO_3$, wherein $0<x<2$, and $0<y<3$, $Li_xGe_yP_zS_w$, wherein $0<x<4$, $0<y<1$, $0<z<1$, and $0<w<5$, $Li_xN_y$, wherein $0<x<4$, and $0<y<2$, $Li_xSi_yS_z$ glass, wherein $0\le x<3$, $0<y<2$, and $0<z<4$, $Li_xP_yS_z$ glass, wherein $0\le x<3$, $0<y<3$, and $0<z<7$, $Li_{3x}La_{2/3-x}TiO_3$, wherein $0\le x\le1/6$, $Li_7La_3Zr_2O_{12}$, $Li_{1+y}Al_yTi_{2-y}(PO_4)_3$, wherein $0\le y\le1$, $Li_{1+z}Al_zGe_{2-z}(PO_4)_3$, wherein $0\le z\le1$, $Li_2O$, LiF, LiOH, $Li_2CO_3$, $LiAlO_2$, a $Li_2O$—$Al_2O_3$—$SiO_2$—$P_2O_5$—$TiO_2$—$GeO_2$ ceramic, $Li_{10}GeP_2S_{12}$, $Li_{3.25}Ge_{0.25}P_{0.75}S_4$, $Li_3PS_4$, $Li_6PS_5Br$, $Li_6PS_5Cl$, $Li_7PS_5$, $Li_6PS_5I$, $Li_{1.3}Al_{0.3}Ti_{1.7}(PO_4)_3$, $LiTi_2(PO_4)_3$, $LiHf_2(PO_4)_3$, $LiZr_2(PO_4)_3$, $Li_3(NH_2)_2I$, $LiBH_4$, $LiAlH_4$, $LiNH_2$, $Li_{0.34}La_{0.51}TiO_{2.94}$, $LiSr_2Ti_2NbO_9$, $Li_{0.06}La_{0.66}Ti_{0.93}Al_{0.03}O_3$, $Li_{0.34}Nd_{0.55}TiO_3$, $Li_2CdCl_4$, $Li_2MgCl_4$, $Li_2ZnI_4$, $Li_2CdI_4$, $Li_{4.9}Ga_{0.5+\delta}La_3Zr_{1.7}W_{0.3}O_{12}$, wherein $0\le\delta<1.6$, $Li_{4.9}Ga_{0.5+\delta}La_3Zr_{1.7}W_{0.3}O_{12}$, wherein $1.7\le\delta\le2.5$, and $Li_{5.39}Ga_{0.5+\delta}La_3Zr_{1.7}W_{0.3}O_{12}$, wherein $0\le\delta<1.11$.

6. The solid electrolyte of claim 1, wherein the inorganic lithium-ion conductor comprises a metal component and an anion, and a loss rate of the metal component and the anion in the inorganic lithium-ion conductor of the first layer after impregnation with a saturated lithium hydroxide solution is within 10 percent of a concentration of the metal component and anion in the first layer before impregnation with the saturated lithium hydroxide solution.

7. The solid electrolyte of claim 1, wherein the solid electrolyte has an ionic conductivity after impregnation with a saturated lithium hydroxide solution of about $1\times10^{-5}$ siemens per centimeter to about $1\times10^{-3}$ siemens per centimeter at 25° C.

8. The solid electrolyte of claim 1, wherein an ionic conductivity of the solid electrolyte after exposure to a saturated lithium hydroxide solution is about 50 percent to about 300 percent of an ionic conductivity of the solid electrolyte prior to exposure to the saturated lithium hydroxide solution.

9. The solid electrolyte of claim 1, wherein the solid electrolyte has an ionic conductivity of about $1\times10^{-6}$ siemens per centimeter to about $1\times10^{-4}$ siemens per centimeter at 25° C.

10. A lithium-air battery comprising:
    a cathode;
    an anode; and
    an electrolyte disposed between the cathode and the anode, wherein the electrolyte comprises the solid electrolyte of claim 1.

11. An electrochemical device comprising the solid electrolyte of claim 1 disposed between a cathode and an anode.

12. The electrochemical device of claim 11, wherein the second layer is between the first layer and the cathode.

13. A method of preparing a solid electrolyte of claim 1, the method comprising:
    providing the first layer comprising the inorganic lithium-ion conductor;
    depositing a compound represented by Formula 3 on at least one surface of the first layer to form a coating; and
    heat-treating the coating to form a second layer,
    wherein the second layer comprises the at least one of the $Li_xZn_{(1-x/2)}O$ or $Li_xZn_{(1-x/2)}(OH)_2$, where $0<x<5$, or $Li_xTi_{(1-x/4)}O_2$, where $0<x\le1$;

$$Li_sM_yO_z \quad \text{Formula 3}$$

wherein, in Formula 3,
    M is at least one of titanium, zinc, and $0\le s<1$, $0<y<5$, and $0<z<5$.

14. The method of claim 13, wherein the compound represented by Formula 3 is represented by $M_yO_z$, wherein $0<y<5$ and $0<z<5$, and
    the depositing of the compound represented by Formula 3 comprises atomic layer deposition, physical vapor deposition, or sputtering.

15. A solid electrolyte comprising:
    a first layer comprising an inorganic lithium-ion conductor; and
    a second layer disposed on at least one surface of the first layer, wherein the second layer comprises at least one of $Li_xTi_{(1-x/4)}O_2$, $Li_xZn_{(1-x/2)}O$, $Li_xZn_{(1-x/2)}(OH)_2$, $Li_xLa_{(2-x/3)}O_3$, $Li_xGd_{(2-x/3)}O_3$, $Li_xGd_{(1-x/3)}(OH)_3$, $Li_xGa_{(2-x/3)}O_3$, $Li_xY_{(2-x/3)}O_3$, $Li_xHf_{(1-x/2)}O_2$, $Li_xLu_{(2-x/3)}O_3$, $Li_xLa_{(1-x/3)}(OH)_3$, $Li_xMg_{(1-x/2)}O$, or $Li_xMg_{(1-x/2)}(OH)_2$, and $0<x<5$,
    with the proviso that if the compound is $Li_xTi_{(1-x/4)}O_2$, $0<x\le1$, and
    the inorganic lithium-ion conductor comprises at least one of garnet-based ceramics $Li_{3+x}La_3M_2O_{12}$, wherein $0\le x\le5$, and M is at least one of W, Ta, Te, Nb, and Zr, and
    doped garnet-based ceramics $Li_{3+x}La_3M_2O_{12}$, wherein $0\le x\le5$, M is at least one of W, Ta, Te, Nb, and Zr, and a dopant is at least one of Ge, Ta, Nb, Al, Ga, Sc, $Li_{1+x+y}Al_xTi_{2-x}Si_yP_{3-y}O_{12}$, wherein $0<x<2$, and $0\le y<3$, $BaTiO_3$, $Pb(Zr_aTi_{1-a})O_3$, wherein $0\le a\le1$, $Pb_{1-x}La_xZr_{1-y}Ti_yO_3$, wherein $0\le x<1$, and $0\le y<1$, $Pb(Mg_{1/3}Nb_{2/3})O_3$—$PbTiO_3$, $Li_3PO_4$, $Li_xTi_y(PO_4)_3$, wherein $0<x<2$, and $0<y<3$, $Li_xAl_yTi_z(PO_4)_3$, wherein $0<x<2$, $0<y<1$, and $0<z<3$, $Li_{1+x+y}(Al_aGa_{1-a})_x(Ti_bGe_{1-b})_{2-x}Si_yP_{3-y}O_{12}$, wherein $0\le x\le1$, $0\le y\le1$, $0\le a\le1$, and $0\le b\le1$, $Li_xLa_yTiO_3$, wherein $0<x<2$, and $0<y<3$, $Li_xGe_yP_zS_w$, wherein $0<x<4$, $0<y<1$, $0<z<1$, and $0<w<5$, $Li_xN_y$, wherein $0<x<4$, and $0<y<2$, $Li_xSi_yS_z$ glass, wherein $0 \leq x<3$, $0<y<2$, and $0<z<4$, $Li_xP_yS_z$ glass, wherein $0 \leq x<3$, $0<y<3$, and $0<z<7$, $Li_{3x}La_{2/3-x}TiO_3$, wherein $0 \leq x \leq 1/6$, $Li_7La_3Zr_2O_{12}$, $Li_{1+y}Al_yTi_{2-y}(PO_4)_3$, wherein $0 \leq y \leq 1$, $Li_{1+z}Al_zGe_{2-z}(PO_4)_3$, wherein $0 \leq z \leq 1$, $Li_2O$, LiF, LioH, $Li_2CO_3$, $LiAlO_2$, a $Li_2O$—$Al_2O_3$—$SiO_2$—$P_2O_5$—$TiO_2$—$GeO_2$ ceramic, $Li_{10}GeP_2S_{12}$, $Li_{3.25}Ge_{0.25}P_{0.75}S_4$, $Li_3PS_4$, $Li_6PS_5Br$, $Li_6PS_5Cl$, $Li_7PS_5$, $Li_6PS_5I$, $Li_{1.3}Al_{0.3}Ti_{1.7}(PO_4)_3$, $LiTi_2(PO_4)_3$, $LiHf_2(PO_4)_3$, $LiZr_2(PO_4)_3$, $Li_3(NH_2)_2I$, $LiBH_4$, $LiAlH_4$, $LiNH_2$, $Li_{0.34}La_{0.51}TiO_{2.94}$, $LiSr_2Ti_2NbO_9$, $Li_{0.06}La_{0.66}Ti_{0.93}Al_{0.03}O_3$, $Li_{0.34}Nd_{0.55}TiO_3$, $Li_2CdCl_4$, $Li_2MgCl_4$, $Li_2ZnI_4$, $Li_2CdI_4$, $Li_{4.9}Ga_{0.5+\delta}La_3Zr_{1.7}W_{0.3}O_{12}$, wherein $0 \leq \delta < 1.6$, $Li_{4.9}Ga_{0.5+\delta}La_3Zr_{1.7}W_{0.3}O_{12}$, wherein $1.7 \leq \delta < 2.5$, and $Li_{5.39}Ga_{0.5+\delta}La_3Zr_{1.7}W_{0.3}O_{12}$, wherein $0 \leq \delta < 1.11$.

16. The solid electrolyte of claim 15, wherein the inorganic lithium-ion conductor comprises at least one of garnet-based ceramics $Li_{3+x}La_3M_2O_{12}$, wherein $0 \leq x \leq 5$, and M is at least one of W, Te, and Nb, doped garnet-based ceramics $Li_{3+x}La_3M_2O_{12}$, wherein $0 \leq x \leq 5$, M is at least one of W, Te, Nb, and Zr, and a dopant is at least one of Ge, Ta, Nb, Al, Ga, and Sc, $BaTiO_3$, $Pb(Zr_aTi_{1-a})O_3$, wherein $0 \leq a \leq 1$, $Pb_{1-x}La_xZr_{1-y}Ti_yO_3$, wherein $0 \leq x < 1$, and $0 \leq y < 1$, $Pb(Mg_{1/3}Nb_{2/3})O_3$—$PbTiO_3$, $Li_3PO_4$, $Li_xTi_y(PO_4)_3$, wherein $0 < x < 2$, and $0 < y < 3$, $Li_xAl_yTi_z(PO_4)_3$, wherein $0 < x < 2$, $0 < y < 1$, and $0 < z < 3$, $Li_{1+x+y}(Al_aGa_{1-a})_x(Ti_bGe_{1-b})_{2-x}Si_yP_{3-y}O_{12}$, wherein $0 \leq x \leq 1$, $0 \leq y \leq 1$, $0 \leq a \leq 1$, and $0 \leq b \leq 1$, $Li_xGe_yP_zS_w$, wherein $0 < x < 4$, $0 < y < 1$, $0 < z < 1$, and $0 < w < 5$, $Li_xN_y$, wherein $0 < x < 4$, and $0 < y < 2$, $Li_xSi_yS_z$ glass, wherein $0 \leq x < 3$, $0 < y < 2$, and $0 < z < 4$, $Li_xP_yS_z$ glass, wherein $0 \leq x < 3$, $0 < y < 3$, and $0 < z < 7$, $Li_2O$, LiF, LiOH, $Li_2CO_3$, $LiAlO_2$, a $Li_2O$—$Al_2O_3$—$SiO_2$—$P_2O_5$—$TiO_2$—$GeO_2$ ceramic, $Li_{10}GeP_2S_{12}$, $Li_{3.25}Ge_{0.25}P_{0.75}S_4$, $Li_3PS_4$, $Li_6PS_5Br$, $Li_6PS_5Cl$, $Li_7PS_5$, $Li_6PS_5I$, $Li_{1.3}Al_{0.3}Ti_{1.7}(PO_4)_3$, $LiTi_2(PO_4)_3$, $LiHf_2(PO_4)_3$, $LiZr_2(PO_4)_3$, $Li_3(NH_2)_2I$, $LiBH_4$, $LiAlH_4$, $LiNH_2$, $LiSr_2Ti_2NbO_9$, $Li_{0.06}La_{0.66}Ti_{0.93}Al_{0.03}O_3$, $Li_{0.34}Nd_{0.55}TiO_3$, $Li_2CdCl_4$, $Li_2MgCl_4$, $Li_2ZnI_4$, $Li_2CdI_4$, $Li_{4.9}Ga_{0.5+\delta}La_3Zr_{1.7}W_{0.3}O_{12}$, wherein $0 \leq \delta < 1.6$, $Li_{4.9}Ga_{0.5+\delta}La_3Zr_{1.7}W_{0.3}O_{12}$, wherein $1.7 \leq \delta < 2.5$, and $Li_{5.39}Ga_{0.5+\delta}La_3Zr_{1.7}W_{0.3}O_{12}$, wherein $0 \leq \delta < 1.11$.

17. The solid electrolyte of claim 15, wherein the inorganic lithium-ion conductor comprises $Li_2O$—$Al_2O_3$—$SiO_2$—$P_2O_5$—$TiO_2$.

18. An electrochemical device comprises the solid electrolyte of claim 15 between a cathode and an anode.

19. The electrochemical device of claim 18, wherein the second layer is between the first layer and the cathode.

20. The solid electrolyte of claim 15, wherein a loss rate of the metal component and the anion in the inorganic lithium-ion conductor of the first layer after impregnation with a saturated lithium hydroxide solution is within 10 percent of a concentration of the metal component and anion in the first layer before impregnation with the saturated lithium hydroxide solution.

21. The solid electrolyte of claim 1, wherein the inorganic lithium-ion conductor comprises at least one of garnet-based ceramics $Li_{3+x}La_3M_2O_{12}$, wherein $0 \leq x \leq 5$, and M is at least one of W, Ta, Te, Nb, and Zr.

* * * * *